(12) United States Patent
Yamazaki et al.

(10) Patent No.: US 7,825,021 B2
(45) Date of Patent: Nov. 2, 2010

(54) METHOD FOR MANUFACTURING DISPLAY DEVICE

(75) Inventors: Shunpei Yamazaki, Tokyo (JP); Toru Takayama, Kanagawa (JP); Kengo Akimoto, Kanagawa (JP); Hajime Tokunaga, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 579 days.

(21) Appl. No.: 11/028,478

(22) Filed: Jan. 4, 2005

(65) Prior Publication Data

US 2005/0197030 A1 Sep. 8, 2005

(30) Foreign Application Priority Data

Jan. 16, 2004 (JP) ............................. 2004-009778

(51) Int. Cl.
*H01L 21/28* (2006.01)
*H01L 21/3205* (2006.01)

(52) U.S. Cl. ................ 438/608; 438/609; 257/E21.159

(58) Field of Classification Search .................... 257/40, 257/52, 57–60, 103, E21.158–E21.159, E21.468; 438/82, 99, 608–609, FOR. 135; 252/519.5, 252/520.1
See application file for complete search history.

(56) References Cited

U.S. PATENT DOCUMENTS

| | | | |
|---|---|---|---|
| 5,264,077 A | | 11/1993 | Fukui et al. |
| 5,529,937 A | * | 6/1996 | Zhang et al. ................. 438/471 |
| 5,648,276 A | * | 7/1997 | Hara et al. ................... 438/164 |
| 5,883,016 A | * | 3/1999 | Chan et al. ................... 438/798 |
| 5,950,077 A | * | 9/1999 | Ohue et al. .................. 438/149 |
| 5,972,527 A | * | 10/1999 | Kaijou et al. ............... 428/697 |
| 6,222,314 B1 | | 4/2001 | Arai et al. |
| 6,416,888 B1 | | 7/2002 | Kawamura et al. |

(Continued)

FOREIGN PATENT DOCUMENTS

JP 06234521 A * 8/1994

(Continued)

OTHER PUBLICATIONS

Bernstein, J.D. and Chan, C. "Hydrogenation of Polycrystalline Silicon Thin Film Transistors by Plasma Ion Implantation." IEEE Electron Device Letters. vol. 16 (1995): 421-423.*

(Continued)

*Primary Examiner*—Matthew W Such
(74) *Attorney, Agent, or Firm*—Fish & Richardson P.C.

(57) ABSTRACT

It is an object of the present invention to provide a method for manufacturing a highly reliable display device with a preferable yield. A method for manufacturing a display device according to the invention comprises the steps of: forming a first electrode including a conductive material added with a material which prevents crystallization; forming a layer containing an organic compound over the first electrode by heating the first electrode under a reduced pressure at temperatures of 350° C. or higher; and forming a second electrode over the layer containing an organic compound. It is preferable to perform the heat treatment at temperatures of 350° C. or higher, preferably, 375° C. or higher for 12 hours or longer. When the first electrode is formed by using indium tin oxide containing silicon oxide, a highly display device can be manufactured.

30 Claims, 22 Drawing Sheets

U.S. PATENT DOCUMENTS

| | | | |
|---|---|---|---|
| 6,448,158 B2 * | 9/2002 | Peng et al. | 438/487 |
| 6,452,341 B1 * | 9/2002 | Yamauchi et al. | 315/169.1 |
| 6,492,778 B1 | 12/2002 | Segawa | |
| 6,533,965 B1 * | 3/2003 | Sasaki et al. | 252/519.5 |
| 6,541,918 B1 | 4/2003 | Yudasaka | |
| 6,614,174 B1 | 9/2003 | Urabe et al. | |
| 6,680,577 B1 | 1/2004 | Inukai et al. | |
| 6,893,887 B2 | 5/2005 | Yamagata et al. | |
| 7,057,208 B2 | 6/2006 | Akimoto et al. | |
| 7,190,114 B2 | 3/2007 | Yamagata et al. | |
| 7,205,716 B2 | 4/2007 | Yamazaki et al. | |
| 7,517,620 B2 * | 4/2009 | Kim et al. | 430/20 |
| 2001/0008710 A1 * | 7/2001 | Takatsuji et al. | 428/689 |
| 2002/0020840 A1 * | 2/2002 | Nakajima | 257/57 |
| 2002/0153831 A1 | 10/2002 | Sakakura et al. | |
| 2002/0192885 A1 * | 12/2002 | Miyasaka | 438/164 |
| 2003/0153182 A1 * | 8/2003 | Yamazaki et al. | 438/689 |
| 2003/0164290 A1 * | 9/2003 | Chen et al. | 204/192.29 |
| 2003/0197178 A1 * | 10/2003 | Yamazaki et al. | 257/59 |
| 2003/0218153 A1 * | 11/2003 | Abe | 252/500 |
| 2005/0052127 A1 | 3/2005 | Sakata et al. | |
| 2005/0062409 A1 | 3/2005 | Yamazaki et al. | |
| 2005/0082966 A1 | 4/2005 | Yamazaki et al. | |
| 2005/0093432 A1 | 5/2005 | Yamazaki et al. | |
| 2006/0214168 A1 | 9/2006 | Akimoto et al. | |

FOREIGN PATENT DOCUMENTS

| | | | |
|---|---|---|---|
| JP | 11323531 A | * | 11/1999 |
| JP | 2000-357586 A | | 12/2000 |
| JP | 2002-208479 A | | 7/2002 |
| JP | 2002-319495 A | | 10/2002 |
| JP | 2003-297558 | | 10/2003 |

OTHER PUBLICATIONS

Mason, M.G, et al. "Characterization of Treated Indium-Tin-Oxide Surfaces Used in Electroluminescent Devices." Journal of Applied Physics, vol. 86, No. 3 (Aug. 1, 1999): pp. 1688-1692.*

Jung, Y.S. "A Spectroscopic Ellipsometry Study on the Variation of the Optical Constants of Tin-Doped Indium Oxide Thin Films during Crystallization." Solid State Communications, vol. 129 (2004): pp. 491-495.*

Hu, Y., et al. "Effect of Heat Treatment on Properties of ITO Films Prepared by RF Magnetron Sputtering." Vacuum, vol. 75 (2004): pp. 183-188.*

Guillen, C. And Herrero, J. "Electrical Contacts on Polyimide Substrates for Flexible Thin Film Photovoltaic Devices." Thin Solid Films, vol. 431-432 (2003): pp. 403-406.*

* cited by examiner

△: ITO／SiNO
▲: ITO／SiN
○: ITSO／SiNO
●: ITSO／SiN

METHOD FOR MANUFACTURING DISPLAY DEVICE

BACKGROUND OF THE INVENTION

1. Field of the Invention

The present invention relates to a display device that includes an element having a light emitting material sandwiched between electrodes (hereinafter referred to as a "light emitting element"), and to a manufacturing method of the display device. In particular, the invention relates to a display device using a light emitting material that generates EL (Electro Luminescence) (hereinafter also referred to as an "EL material").

2. Description of the Related Art

An EL material (particularly, an organic EL material) that mainly constitutes an EL element is characterized in that it is sensitive to moisture and degrades easily. Therefore, when an EL display device is manufactured, a technique for reducing the moisture content in the device is required. As its measures, a structure in which a drying agent is provided in an EL display device (an electroluminescence device) and then sealed (for example, Reference 1: Japanese Patent Laid-Open No. 2003-297558).

However, even when such measures are taken, the deterioration of an EL display device can not be fully prevented. In other words, a defect caused by the formation of a dot-shaped non-luminescence region or its enlargement in a pixel (hereinafter "a dark spot"), and a defect in which a non-luminescence region from a periphery of a pixel is enlarged over time (hereinafter, "shrink") can not be eliminated.

SUMMARY OF THE INVENTION

It is an object of the present invention to provide a highly reliable display device which can prevent a light emitting element from deteriorating, and a method for manufacturing the display device more simply.

A method for manufacturing a display device according to the invention comprises the steps of: forming a first electrode including a conductive material added with a material which prevents crystallization; heating the first electrode under a reduced pressure at a temperature of 350° C. or higher; forming a layer containing an organic compound over the first electrode; and forming a second electrode over the layer containing an organic compound.

Another method for manufacturing a display device according to the invention comprises the steps of: forming a first electrode including a conductive material added with a material which prevents crystallization; forming an insulating layer to cover an end portion of the first electrode; heating the first electrode and the insulating layer under a reduced pressure at a temperature of 350° C. or higher; forming a layer containing an organic compound over the first electrode; and forming a second electrode over the layer containing an organic compound.

Another method for manufacturing a display device according to the invention comprises the steps of: forming a thin film transistor having a wiring; forming an insulating film containing hydrogen over the thin film transistor; forming a first electrode including a conductive material added with a material which prevents crystallization so as to be in contact with the wiring; performing hydrogenation of the thin film transistor and dehydration treatment of the first electrode simultaneously by heating the thin film transistor, the insulating film and the first electrode under a reduced pressure at a temperature of 350° C. or higher; forming a layer containing an organic compound over the first electrode; and forming a second electrode over the layer containing an organic compound.

Another method for manufacturing a display device according to the invention comprises the steps of: forming a thin film transistor having a wiring; forming an insulating film containing hydrogen over the thin film transistor; forming a first electrode including a conductive material added with a material which prevents crystallization so as to be in contact with the wiring; forming an insulating layer so as to cover the thin film transistor, the wiring and an end portion of the first electrode; performing hydrogenation of the thin film transistor and dehydration treatment of the first electrode and the insulating layer simultaneously by heating the thin film transistor, the insulating film, the first electrode and the insulating layer under a reduced pressure at a temperature of 350° C. or higher; forming a layer containing an organic compound over the first electrode; and forming a second electrode over the layer containing an organic compound.

Another method for manufacturing a display device according to the invention comprises the steps of: forming a first electrode; heating the first electrode under a reduced pressure at a temperature of 350° C. or higher and a temperature at which the first electrode is not crystallized; forming a layer containing an organic compound over the first electrode; and forming a second electrode over the layer containing an organic compound.

Another method for manufacturing a display device according to the invention comprises the steps of: forming a first electrode; forming an insulating layer to cover an end portion of the first electrode; heating the first electrode and the insulating layer under a reduced pressure at a temperature of 350° C. or higher and a temperature at which the first electrode is not crystallized; forming a layer containing an organic compound over the first electrode; and forming a second electrode over the layer containing an organic compound.

Another method for manufacturing a display device according to the invention comprises the steps of: forming a thin film transistor having a wiring; forming an insulating film containing hydrogen over the thin film transistor; forming a first electrode so as to be in contact with the wiring; performing hydrogenation of the thin film transistor and dehydration treatment of the first electrode simultaneously by heating the thin film transistor, the insulating film and the first electrode under a reduced pressure at a temperature of 350° C. or higher and a temperature at which the first electrode is not crystallized; forming a layer containing an organic compound over the first electrode; and forming a second electrode over the layer containing an organic compound.

Another method for manufacturing a display device according to the invention comprises the steps of: forming a thin film transistor having a wiring; forming an insulating film containing hydrogen over the thin film transistor; forming a first electrode so as to be in contact with the wiring; forming an insulating layer so as to cover the thin film transistor, the wiring and an end portion of the first electrode; performing hydrogenation of the thin film transistor and dehydration treatment of the first electrode and the insulating layer simultaneously by heating the thin film transistor, the insulating film, the first electrode and the insulating layer under a reduced pressure at a temperature of 350° C. or higher and a temperature at which the first electrode is not crystallized; forming a layer containing an organic compound over the first electrode; and forming a second electrode over the layer containing an organic compound.

According to the invention, a display device in which degasification is not generated can be manufactured without increasing the number of steps; therefore, a light emitting element can be prevented from deteriorating. Hence, a highly reliable display device which can display a high-definition and high-quality image can be manufactured with a preferable yield.

DETAILED DESCRIPTION OF THE INVENTION

Embodiment Mode 1

Figure 1A:
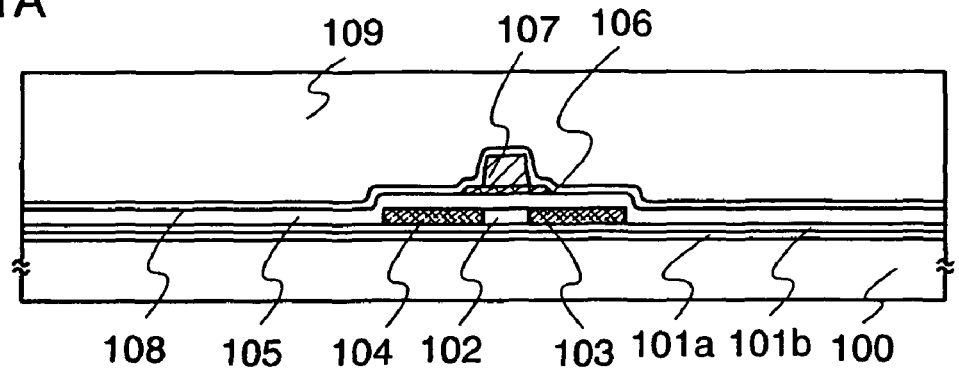
FIGS. 1A to 1D show views describing a method for manufacturing a display device according to a certain aspect of the present invention.
Figure 1B:
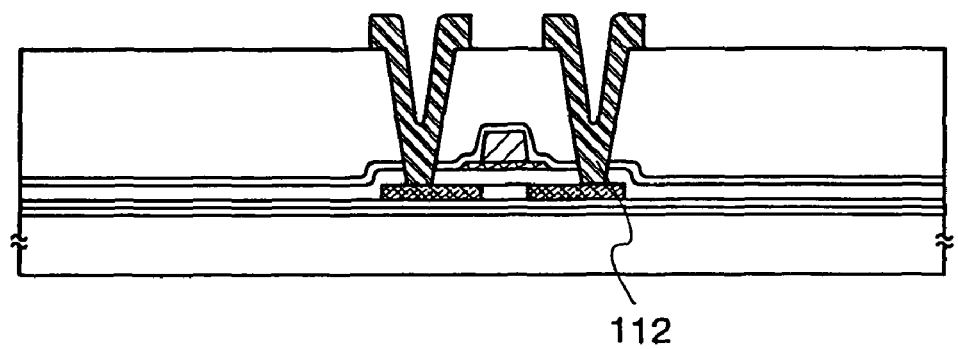
Figure 1C:
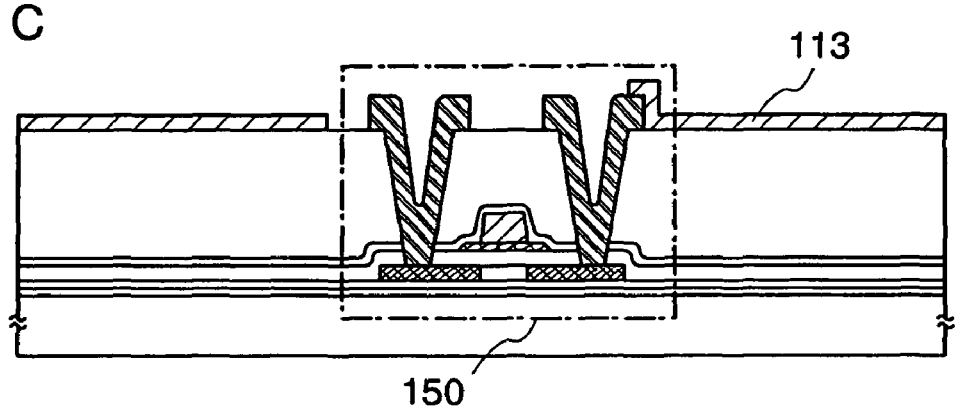

Embodiment Mode of the present invention will be described in detail with reference to the accompanying drawings. However, it is to be understood that the invention is not limited to the description below and various changes and modifications will be apparent to those skilled in the art, unless such changes and modifications depart from the content and scope of the invention. Therefore, the invention is not interpreted with limiting to the description in this embodiment mode. Note that the same reference numerals denote the same parts or parts having the same function in different drawings and the explanation will not be repeated in a constitution of the invention hereinafter explained.

Figure 14A:
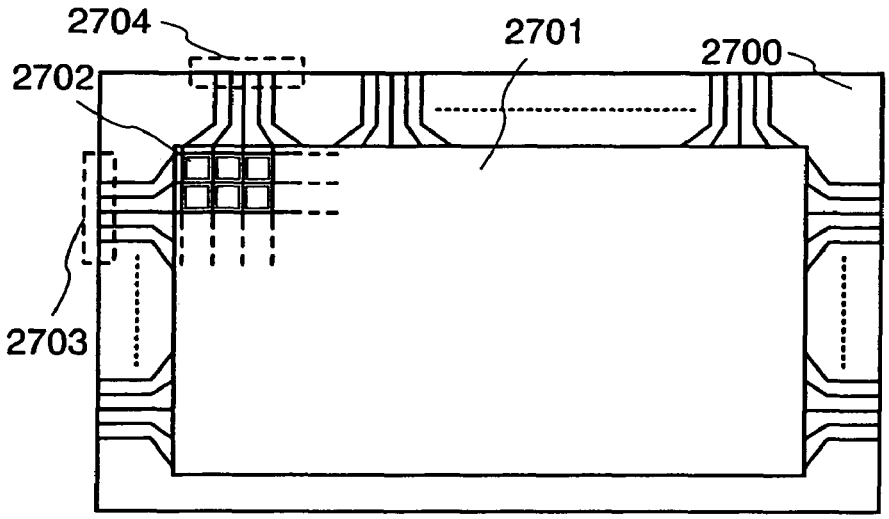
FIGS. 14A to 14C show top views of a display device according to a certain aspect of the invention.

FIG. 14A shows a top view of a structure of a display panel according to the invention. A pixel portion 2701 in which pixels 2702 are arranged in a matrix, a scanning line input terminal 2703, and a signal line input terminal 2704 are formed over a substrate 2700 having an insulating surface. The number of pixels may be provided according to various standards. The number of pixels of XGA may be 1024×768×3 (RGB), that of UXGA may be 1600×1200×3 (RGB), and that of a full-speck high vision to correspond thereto may be 1920×1080×3 (RGB).

The pixels 2702 are arranged in a matrix by intersecting a scanning line extended from the scanning line input terminal 2703 with a signal line extended from the signal line input terminal 2704. Each pixel 2702 is provided with a switching element and a pixel electrode connected thereto. A typical example of the switching element is a TFT. A gate electrode side of a TFT is connected to the scanning line, and a source or drain side thereof is connected to the signal line; therefore, each pixel can be controlled independently by a signal inputted from outside.

A TFT includes a semiconductor layer, a gate insulating layer, and a gate electrode as main components. A wiring connected to one of a source region and a drain region which are formed in the semiconductor layer is concomitant thereof. A top gate type in which a semiconductor layer, a gate insulating layer, and a gate electrode layer are sequentially arranged from the substrate side, a bottom gate type in which a gate electrode layer, a gate insulating layer, and a semiconductor layer are sequentially arranged from the substrate side, and the like are known as typical structures of a TFT. However, any one of the structures may be applied to the invention.

An amorphous semiconductor (hereinafter also referred to as an "AS") manufactured by a vapor phase growth method using a semiconductor material gas typified by silane or germane or a sputtering method; a polycrystalline semiconductor that is formed by crystallizing the amorphous semiconductor by utilizing light energy or thermal energy; a semi-amorphous (also referred to as microcrystallite or microcrystalline, and hereinafter also referred to as an "SAS") semiconductor; or the like can be used for a material which forms a semiconductor layer.

A SAS is a semiconductor with an intermediate structure between an amorphous structure and a crystal structure (including a single crystal and a polycrystal). This is a semiconductor having a third condition that is stable in regard to a free energy, and a crystalline region having a short-range order and lattice distortion is included therein. A crystalline region of from 0.5 nm to 20 nm can be observed at least in a part of a region in the film. When silicon is contained as the main component, Raman spectrum is shifted to a lower wavenumber side less than 520 cm$^{-1}$. Diffraction peak of (111) or (220) to be caused by a crystal lattice of silicon is observed in X-ray diffraction. At least 1 atomic % of hydrogen or halogen is contained to terminate a dangling bond. A SAS is formed by carrying out grow discharge decomposition (plasma CVD) of a silicide gas. In addition to $SiH_4$; $Si_2H_6$, $SiH_2Cl_2$, $SiHCl_3$, $SiCl_4$, $SiF_4$, or the like can be used for the silicide gas. In addition, $GeF_4$ may be mixed. This silicide gas may be diluted with $H_2$ or $H_2$ and one or more of the rare gas element of He, Ar, Kr, and Ne. A dilution ratio ranges from 2 times to 1000 times. A pressure ranges approximately from 0.1 Pa to 133 Pa, and a power supply frequency ranges from 1 MHz to 120 MHz, preferably from 13 MHz to 60 MHz. A substrate heating temperature may be 300° C. or lower. It is desirable that an atmospheric constituent impurity such as oxygen, nitrogen, or carbon is $1 \times 10^{20}/cm^3$ or less as an impurity element in the film, specifically an oxygen concentration is $5 \times 10^{19}/cm^3$ or less, preferably $1 \times 10^{19}/cm^3$ or less.

Figure 15A:
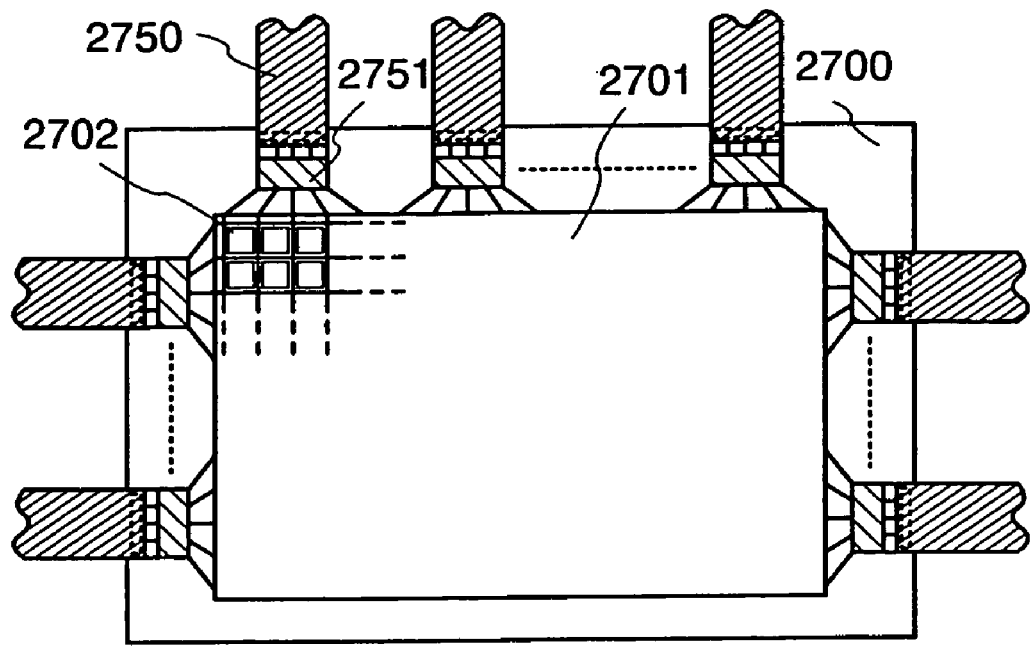
FIGS. 15A and 15B show top views of a display device according to a certain aspect of the invention.
Figure 15B:
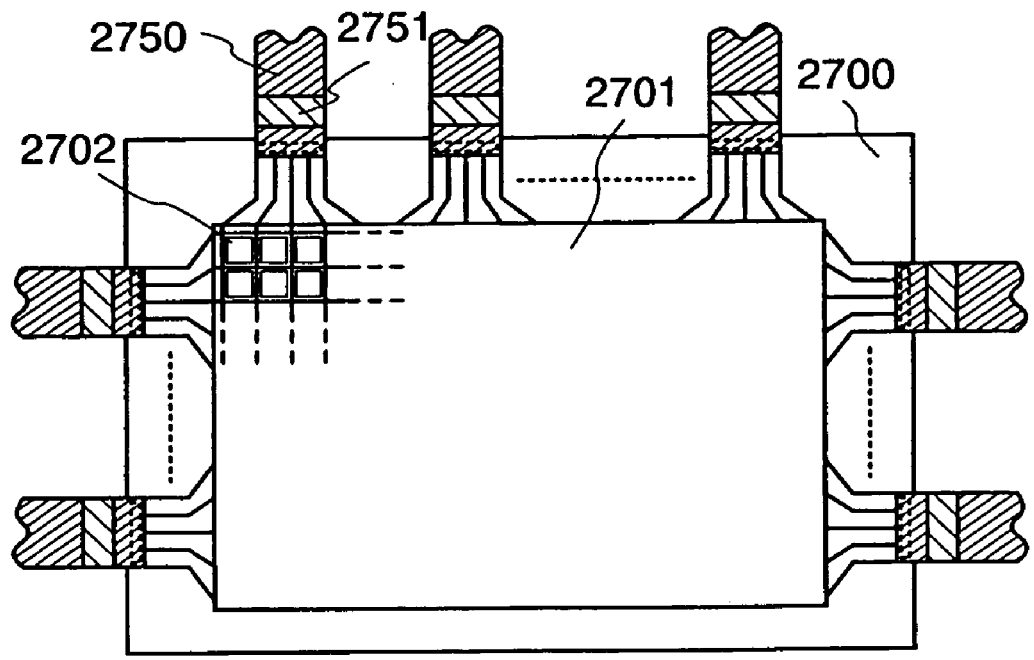

FIG. 14A shows a structure of a display panel that controls a signal to be inputted into a scanning line and a signal line by an external driver circuit. Furthermore, a driver IC 2751 may be mounted over a substrate 2700 by a COG (Chip on Glass) method as shown in FIG. 15A. As another embodiment mode, a TAB (Tape Automated Bonding) method may be also used as shown in FIG. 15B. The driver IC may be formed over a single crystal semiconductor substrate, or the one in which a circuit is formed of a TFT over a glass substrate. In FIGS. 15A and 15B, the driver IC 2751 is connected to an FPC 2750.

Figure 14B:
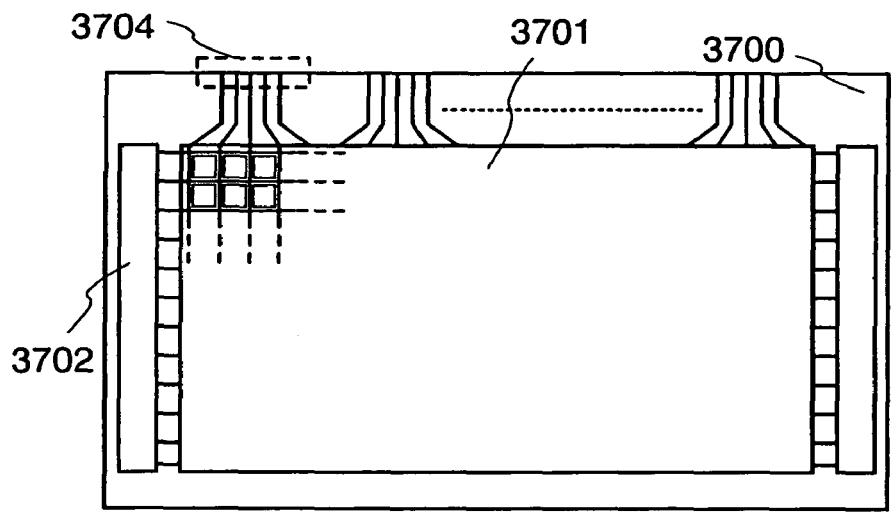

When a TFT provided in a pixel is formed of a SAS, a scanning line driver circuit 3702 may be integrally formed over a substrate 3700 as shown in FIG. 14B. In FIG. 14B, reference numeral 3701 denotes a pixel portion, and a signal line driver circuit is controlled by an external driver circuit in the same manner as FIG. 14A. When a TFT provided in a pixel is formed of polycrystalline (microcrystallite) semiconductor, a single crystalline semiconductor or the like having high mobility, a scanning line driver circuit 4702 and a signal line driver circuit 4704 can be integrally formed over a glass substrate 4700 in FIG. 14C.

A manufacturing method of a display device according to the invention is described in detail with reference to FIGS. 1A to 1D, 2A and 2B, and 5.

A base film 101a is formed to have film thicknesses of from 10 nm to 200 nm (preferably, from 50 nm to 100 nm) by using a silicon nitride oxide (SiNO) film by a plasma CVD method, and a base film 101b is laminated to have film thicknesses of from 50 nm to 200 nm (preferably, from 100 nm to 150 nm) by using a silicon oxynitride (SiON) film over a substrate 100 having an insulating surface as a base film 101. As the substrate 100, a glass substrate, a quartz substrate, a silicon substrate, a metal substrate or a stainless substrate over which an insulating film is formed may be used. Additionally, a plastic substrate having heat-resistance which can withstand a process temperature of this embodiment mode, or a flexible substrate such as a film may be also used. Alternatively, a two-layer structure may be employed for the base film, or a single-layer film structure of the base (insulating) film or a structure in which the base (insulating) films are laminated to have two layers or more.

Subsequently, a semiconductor film is formed over the base film. The semiconductor film may be formed with thicknesses of from 25 nm to 200 nm (preferably, from 30 nm to 150 nm) by a known method (a sputtering method, an LPCVD method, a plasma CVD method, or the like). A material for the semiconductor film is not particularly limited, however, the semiconductor film is preferably formed of silicon, a silicon germanium (SiGe) alloy or the like.

A semiconductor film uses an amorphous semiconductor (typically hydrogenated amorphous silicon) or a crystalline semiconductor (typically polysilicon) as a material. Polysilicon includes so-called high-temperature polysilicon which uses polycrystalline silicon processed at temperatures of 800° C. or higher as a main component, so-called low-temperature polysilicon which uses polycrystalline silicon processed at temperatures of 600° C. or lower, and crystalline silicon which is crystallized by being added with an element promoting crystallization, or the like.

As another material, a semi-amorphous semiconductor film or a semiconductor film, a part of which has crystal phase can be used. A semi-amorphous semiconductor is a semiconductor which has an intermediate structure between an amorphous structure and a crystalline structure (including single crystal and polycrystal). The semi-amorphous semiconductor has a third condition that is stable with respect to free energy, and is crystalline having short-range order and lattice distortion. Typically, the semi-amorphous semiconductor contains silicon as a main component, and Raman spectrum is shifted to a lower wavenumber side less than 520 $cm^{-1}$ with lattice distortion. At least 1 atomic % of hydrogen or halogen is contained to terminate a dangling bond. Here, such a semiconductor is referred to as a semi-amorphous semiconductor (hereinafter, an "SAS"). The SAS is also referred to as a microcrystalline semiconductor (typically, microcrystallite silicon).

The SAS can be obtained by performing glow discharging decomposition (plasma CVD) of a silicide gas. As a typical silicide gas, $SiH_4$, additionally, $Si_2H_6$, $SiH_2Cl_2$, $SiHCl_3$, $SiCl_4$, $SiF_4$, or the like can be used. The silicide gas may be mixed with $GeF_4$ and $F_2$. The formation of the SAS can be facilitated by using the silicide gas, which is diluted with hydrogen or a mixture of hydrogen and at least one rare gas of helium, argon, krypton, and neon. A dilution ratio of hydrogen with respect to the silicide gas is, for example, preferably in the range of from 2 times to 1000 times in terms of flow ratio. Naturally, although it is preferable that the formation of the SAS by glow discharge decomposition is performed under a reduced pressure, the formation can be also performed by using discharge at atmospheric pressure. As a representative example, the formation may be performed in the pressure range of from 0.1 Pa to 133 Pa. The power supply frequency for generating the glow discharge is in the range of from 1 MHz to 120 MHz, and more preferably, in the range of from 13 MHz to 60 MHz. A high-frequency power supply may be set appropriately. A temperature for heating the substrate is preferably 300° C. or lower, and temperatures in the range of from 100° C. to 200° C. are also permissible. Among impurity elements which are mainly added in forming a film, impurity elements derived from atmospheric constituents such as oxygen, nitrogen and carbon desirably have concentrations of $1 \times 10^{20}$ $cm^{-3}$ or less. In particular, the concentration of oxygen is preferably $5 \times 10^{19}$ $cm^{-3}$ or less, and more preferably $1 \times 10^{19}$ $cm^{-3}$ or less. A preferable SAS can be obtained by adding a rare gas element such as helium, argon, krypton, neon or the like, thereby promoting lattice distortion, thus, the stability is improved. A SAS layer formed of a hydrogen based gas may be laminated over a SAS layer formed of a fluorine-based gas as a semiconductor layer.

When a crystalline semiconductor film is used for the semiconductor film, the crystalline semiconductor film may be manufactured by a known method (a laser crystallization method, a thermal crystallization method, a thermal crystallization method using an element such as nickel which promotes crystallization, or the like). In the case of not introducing an element which promotes crystallization, hydrogen is emitted to make the hydrogen concentration in the amorphous silicon film $1 \times 10^{20}$ $atoms/cm^2$ or less by heating the amorphous silicon film for 1 hour under nitrogen atmosphere at 500° C. before irradiating the amorphous silicon film with laser light. This is because the amorphous silicon film is destroyed when the film containing a large amount of hydrogen is irradiated with laser light.

A method for introducing a metal element to the amorphous semiconductor film is not limited as long as it is a method for making the metal element exist on a surface of the amorphous semiconductor film or therein. For example, a sputtering method, a CVD method, a plasma treatment method (including a plasma CVD method), an absorption method, or a method of applying a solution of metal salt can be used. Among these, a method of using a solution is easy and advantageous in view of being easy to adjust the concentration of the metal element. It is desirable to form an oxide film by UV light irradiation under oxygen atmosphere, a thermal oxidation method, treatment by using ozone water containing hydroxyl radical or using hydrogen peroxide, or the like to improve wettability of a surface of the amorphous semiconductor film to diffuse a water solution on the entire surface of the amorphous semiconductor film.

The amorphous semiconductor film may be crystallized by combining thermal treatment and laser light irradiation, or thermal treatment or laser light irradiation may be separately performed plural times. When crystallization is performed by two steps of thermal treatment and laser light irradiation, the thermal treatment is performed for from 4 hours to 20 hours at temperatures of from 500° C. to 550° C. after introducing the metal element to crystallize the amorphous semiconductor film (hereinafter referred to as a first crystalline semiconductor film).

The first crystalline semiconductor film is irradiated with laser light to promote crystallization, and then, a second crystalline semiconductor film is obtained. In the laser crystallization method, a semiconductor film is irradiated with laser light. The laser to be used is preferably a solid laser, a gas laser, or a metal laser with pulsed or continuous oscillation. Examples of a solid laser include, a YAG laser, a $YVO_4$ laser, a YLF laser, a $YAlO_3$ laser, a glass laser, a ruby laser, an alexandrite laser, and a Ti: sapphire laser and the like. Examples of a gas laser include an excimer laser, an Ar laser, a Kr laser, and a $CO_2$ laser and the like, and examples of a metal laser include a helium-cadmium laser, a copper vapor laser, and a gold vapor laser. The laser beam can be converted into higher harmonics with a nonlinear optical element. In terms of conversion efficiency, excellent results are obtained when, for example, crystals called LBO, BBO, KDP, KTP, KB5, or CLBO is used for the nonlinear optical element. The conversion efficiency can be remarkably increased when those nonlinear optical elements are placed into a laser resonator. In higher harmonics lasers, Nd, Yb, Cr, or the like is generally doped, and laser is oscillated when it is excited. The dopant type may be appropriately selected by a practitioner.

Alternatively, a crystalline semiconductor layer may be formed directly over the substrate by a plasma method. A crystalline semiconductor layer may be selectively formed over a substrate by using a plasma method.

As the semiconductor, an organic semiconductor using an organic material may be used. As the organic semiconductor, a low molecular weight material, a high molecular weight material or the like is used, and a material such as an organic pigment or a conductive high molecular weight material can be also used.

A minute amount of impurity elements (boron or phosphorous) is doped into thus obtained semiconductor film to control the threshold voltage of a TFT. In this embodiment mode, a crystalline semiconductor layer is used.

A first photomask is manufactured to form a semiconductor layer 102 by patterning treatment using a photolithography method.

A gate insulating film 105 covering the semiconductor layer 102 is formed. The gate insulating film 105 is formed of an insulating film containing silicon with thicknesses of from 40 nm to 150 nm by using a plasma CVD method or a sputtering method. The gate insulating film 105 may be formed of a known material such as an oxide material or nitride material of silicon, and may be a laminated layer or a single layer. In this embodiment mode, a laminated layer of three-layer: a silicon nitride film, a silicon oxide film, and a silicon nitride film is used. Alternatively, a single layer or a laminated layer of two layers formed of thereof and a silicon oxynitride film may be also used. Preferably, a precise silicon nitride film may be used. Note that a rare gas element such as argon may be added to a reactive gas to mix in an insulating film to be formed in order to form a precise insulating film having little gate leak current, at low film formation temperature.

A first conductive film with film thicknesses of from 20 nm to 100 nm and a second conductive film with film thicknesses of from 100 nm to 400 nm, each of which serves as a gate electrode are formed and laminated over the gate insulating film 105. The first and the second conductive films may be formed of an element of Ta, W, Ti, Mo, Al, and Cu, or an alloy material or a compound material having the foregoing element as a main component. A semiconductor film represented by a polycrystalline silicon film that is doped with an impurity element such as phosphorus or an AgPdCu alloy may be used as the first and second conductive films. The conductive film is not limited to the two-layer structure, and, for example, a three-layer structure in which a 50 nm thick tungsten film, a 500 nm thick alloy film of aluminum and silicon (Al—Si), and a 30 nm thick titanium nitride film are sequentially laminated may be applied. In the case of the three-layer structure, tungsten nitride may be used in stead of tungsten of the first conductive film; an alloy film of aluminum and titanium (Al—Ti) may be used in stead of an alloy film of aluminum and silicon (Al—Si) of the second conductive film; or a titanium film may be used in stead of a titanium nitride film of a third conductive film. Further, a single layer structure may be also used.

Then, a second photomask formed of a resist is manufactured by using a photolithography method to perform first etching treatment to form an electrode and a wiring. The first conductive film and the second conductive film can be etched to have a desired tapered shape by appropriately adjusting an etching condition (electric power applied to a coil-shaped electrode, electric power applied to an electrode on a substrate side, electrode temperature on a substrate side or the like) by using an ICP (Inductively Coupled Plasma) etching method. As an etching gas, a chlorine-based gas typified by $Cl_2$, $BCl_3$, $SiCl_4$, $CCl_4$ or the like, a fluorine-based gas typified by $CF_4$, $SF_6$, $NF_3$ or the like, or $O_2$ can be appropriately used.

A conductive layer (a first conductive layer and a second conductive layer) with a first shape including the first conductive layer and the second conductive layer is formed by the first etching treatment.

Then, second etching treatment is performed without removing a mask formed of a resist. Here, a W film is selectively etched. At this time, the second conductive layer is formed by the second etching treatment. On the other hand, the first conductive layer is hardly etched and forms a second shape conductive layer. Hence, conductive layers 106 and 107 are formed. In a terminal portion where electrical connection with the external is performed, conductive layers 180 and 181 functioning as a terminal electrode are also formed in this step. In this embodiment mode, the conductive layer is formed by dry etching. However, the conductive layer may be also formed by wet etching.

Figure 5:
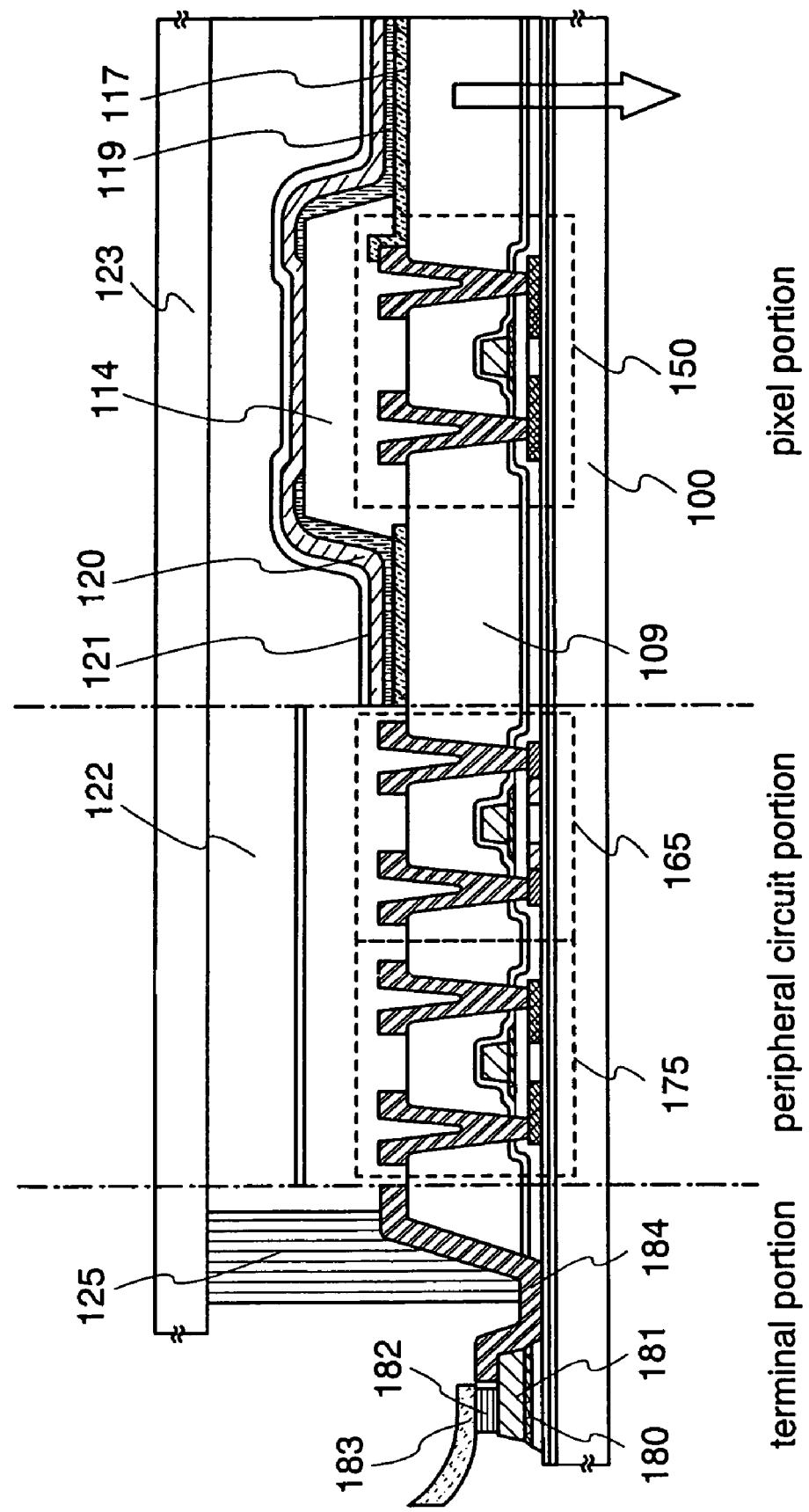
FIG. 5 shows a view describing a display device according to a certain aspect of the invention.

Then, an impurity region is formed in the semiconductor layer. Although an n-type impurity region is not shown in FIGS. 1A to 1D and 2A and 2B since only a pixel portion is shown in the views, this embodiment mode includes a TFT of a peripheral circuit portion which has an n-type impurity region as shown in FIG. 5 which is a further detailed view of a display device. A resist mask is newly formed by using a third photomask after removing the resist mask. A first doping step is performed to dope an impurity element which imparts n-type conductivity (typically, phosphorus (P) or arsenic (As)) to a semiconductor at the low concentration to form an n-channel type TFT. The resist mask covers a region which is to be a p-channel type TFT and a region adjacent to the conductive layer. A low concentration impurity region is formed by performing through-doping via the insulating layer in the first doping step. A plurality of TFTs are used to drive one light emitting element. The above-mentioned doping step is not necessary when the light emitting element is driven only by a p-channel type TFT.

Then, a resist mask is newly formed by using a fourth photomask after removing the resist mask. A second doping step is performed to dope an impurity element which imparts p-type (typically, boron (B)) to a semiconductor at the high concentration. P-type impurity regions 103 and 104 are formed by performing through-doping via the gate insulating film 105 by the second doping step.

Then, a resist mask is newly formed by using a fifth photomask. Here, a third doping step is performed to dope an impurity element which inparts n-type conductivity (typically, phosphorus or arsenic) to a semiconductor at the high concentration to form an n-channel type TFT. Ion doping in the third doping step is performed under the condition that the amount of doze is set at from $1\times10^{13}$ atoms/cm$^2$ to $5\times10^{15}$ atoms/cm$^2$; and the acceleration voltage, from 60 keV to 100 keV. The resist mask covers a region to be a p-channel type TFT. An n-type low concentration impurity region and high concentration impurity region are formed by performing through-doping via the gate insulating film 105 by the third doping step.

Through the above-mentioned steps, the impurity region is formed in each semiconductor layer.

Subsequently, an insulating film 108 containing hydrogen is formed as a passivation film after removing the mask formed of a resist. The insulating film 108 is formed of an insulating film containing silicon with thicknesses of from 100 nm to 200 nm by using a plasma CVD method or a sputtering method. The insulating film 108 is not limited to a silicon nitride film. The insulating film 108 may be a silicon nitride oxide (SiNO) film using a plasma CVD method and other insulating films containing silicon may be also used in a single layer or a laminated structure.

The insulating film 108 can be formed of a material containing a substance of silicon nitride, silicon oxide, silicon oxynitride (SiON), silicon nitride oxide (SiNO), aluminum nitride (AlN), aluminum oxynitride (AlON), aluminum nitride oxide (AlNO) having more nitrogen content than oxygen content (AlNO), aluminum oxide, diamond like carbon (DLC), or a nitrogen-containing carbon film (CN) film. Alternatively, a material in which a skeleton is configured by the bond of silicon (Si) and oxygen (O) LA and which contains at least hydrogen as a substituent, or a material having at least one of fluorine, an alkyl group, and aromatic hydrocarbon as a substituent may be used.

Heat treatment, intense light irradiation, or laser light irradiation may be performed to activate the impurity element. Plasma damage to the gate insulating film and plasma damage to an interface between the gate insulating film and the semiconductor layer can be recovered at the same time of the activation.

An insulating layer 109 which serves as an interlayer insulating film is then formed. As the interlayer insulating film provided for planarization in the invention, a film having high heat resistance and insulation as well as high planarity ratio is required. Therefore, a thermostable planarizing film is preferable. An application method typified by a spin coat method is preferably used as a formation method of the insulating layer.

In this embodiment mode, as a material of the insulating layer 109, an application film in which a skeleton is configured by the bond of silicon (Si) and oxygen (O), and which includes at least one kind of hydrogen, fluorine, an alkyl group and aromatic hydrocarbon as a substituent is used. A film which is baked can be referred to as a silicon oxide (SiOx) film containing an alkyl group. The silicon oxide (SiOx) film containing an alkyl group has high light-transmitting properties and can withstand heat treatment at 300° C. or higher.

In the embodiment mode, the formation method of the insulating layer 109 by an application method is as follows. Initially, thinner pre-wet treatment is performed to improve wettability after performing washing with purified water. Then, a liquid raw material called varnish in which a low molecular weight ingredient (a precursor) having the bond of silicon (Si) and oxygen (O) is dissolved into a solvent is applied over the substrate by a spin coat method or the like. Afterwards, a thin film can be obtained by conducting volatilization (evaporation) of a solvent and crosslinking reaction of the low molecular weight ingredient by heating the varnish along with a substrate. Then, a portion of the application film formed in a circumference of the substrate is removed. When an insulating layer (a partition wall) is formed, a patterning for forming in a desired shape may be performed. In addition, a film thickness is controlled by a spin rotation rate, rotation time, and the concentration and viscosity of the varnish.

Here, a formation procedure of the insulating layer 109 is described in detail.

First, a pure water washing is performed on a substrate to be processed. Megasonic washing may be also performed on the substrate to be processed. Next, after performing dehydrobaking for 110 seconds at 140° C., a temperature of the substrate is regulated by cooling for 120 seconds with a water-cooled plate. Next, the substrate is transferred to and placed in a spin application apparatus.

The spinning application apparatus has a nozzle and an application cup. The spinning application apparatus has a mechanism in which a solution of an application material is dropped on a substrate, and the substrate is placed horizontally in the application cup and the entire application cup rotates. The spinning application apparatus also has a mechanism in which the pressure of atmosphere in the application cup can be controlled.

Next, pre-wet application is performed to improve wettability with the use of an organic solvent such as thinner (a volatile mixture solvent formed by mixing aromatic hydrocarbon (toluene or the like), alcohols, ester acetate or the like). Thinner is thrown off by spinning the substrate with high speed (rotation rate, 450 rpm), after spreading the thinner thoroughly with centrifugal force by spinning the substrate (rotation rate, 100 rpm) as dropping 70 ml of the thinner.

Subsequently, the solution of the material to be applied using a liquid raw material in which siloxane-based polymer is dissolved in a solvent (propylene glycolmonomethyl ether) is thoroughly spread by centrifugal force with gradually spinning (rotation rate from 0 rpm to 1000 rpm) the substrate and dropping the solution of the material to be applied from the nozzle. The application material solution can be classified into, for example, quartz glass, alkyl siloxane polymer, alkyl silsesquioxane polymer, hydrogenated silsesquioxane polymer, hydrogenated alkyl silsesquioxane polymer and the like according to a structure of siloxane. As an example of siloxane-based polymer, an application insulating film material, production name: PSB-K1, PSB-K31 manufactured by Toray Industries, Inc., or an application insulating film material, production name: ZRS-5PH manufactured by Catalysts & Chemicals Industries Co., Ltd. can be given. Then, the substrate is gradually spun (rotation rate from 0 rpm to 1400 rpm) after holding the substrate for 30 seconds for leveling a film formed by the application step.

Inside of the application cup is exhausted to be decompressed, then a reduced pressure drying is performed for within 1 minute.

Edge removing treatment is performed by an edge remover equipped in the spinning application apparatus. The edge remover is equipped with a moving means which moves in parallel along the periphery of the substrate. In the edge remover, a thinner discharging nozzle is provided to sandwich one side of the substrate, and a circumference of the application film is dissolved by the thinner; thereby removing the application film in the circumference of the substrate edge face by exhausting liquid and a gas.

Then, prebaking is performed by conducting baking for 170 seconds at 110° C.

The substrate is transferred from the spinning application apparatus and cooled. Then, baking is further performed for 1 hour at 270° C.

In this way, the insulating film 109 is formed.

The insulating film 109 may be also formed by a droplet discharging method. When a droplet discharging method is used, a material solution can be saved. In addition, according to the invention, not only the insulating layer 109 but also a conductive layer, which forms a wiring layer or an electrode, and a pattern necessary for manufacturing a display device such as a mask layer for forming a predetermined pattern may be formed by a method capable of selectively forming a pattern like a droplet discharge method. A predetermined pattern (a conductive layer, an insulating layer, or the like) can be formed by a droplet discharge (spray) method (also referred to as an ink-jet method by the system to be applied) by selectively discharging (spraying) a droplet of a composition mixed for a particular object. At this time, pretreatment to form a titanium oxide film or the like in a region to be formed may be carried out. In addition, a method in which the pattern can be transferred or drawn, for example, a printing method (a method in which a pattern is formed such as screen printing or offset printing) or the like can be also used.

In addition to an insulating film in which a skeleton is configured by the bond of silicon (Si) and oxygen (O), the insulating layer 109 can be also formed by using a film made from a kind or a plurality of kinds or a lamination thereof of an inorganic material (silicon oxide, silicon nitride, silicon oxynitride, silicon nitride oxide, or the like), a photosensitive or non-photosensitive organic material (an organic resin material) (a resist material such as polyimide, acrylic, polyamide, polyimidamide, benzocyclobutene), or a Low k material having low dielectric constant, as long as they have high heat resistance and satisfactory planarity.

Then, a contact hole (an opening portion) is formed in the insulating layer 109 by using a resist mask and at the same time the insulating layer at a periphery region is removed. Etching (wet etching or dry etching) is performed under the condition where a selective ratio can be obtained with respect to the insulating layer formed under the insulating layer 109. Inert gas may be added to an etching gas to be used. An element of one or more of He, Ne, Ar, Kr and Xe can be used for an inert element to be added. Specifically, it is preferable to use argon having a comparatively large atomic radius and which is inexpensive. In this embodiment mode, $CF_4$, $O_2$, He and Ar are used. An etching condition during dry etching is as follows: a flow rate of $CF_4$ is 380 sccm; a flow rate of $O_2$, 290 sccm; a flow rate of He, 500 sccm; a flow rate of Ar, 500 sccm; an RF power, 3000 W; and a pressure, 25 Pa. According to the above-mentioned condition, an etching residue can be decreased.

In addition, the etching time may be increased at the rate of about from 10% to 20% and over-etching may be performed for etching the gate insulating film 105 without leaving a residue on its surface. One time etching or plural times of etching may be conducted to obtain a tapered shape. The tapered shape may be obtained by further performing the second time dry etching with the use of $CF_4$, $O_2$ and He by setting a flow rate of $CF_4$ at 550 sccm; a flow rate of $O_2$, 450 sccm; a flow rate of He, 350 sccm; an RF power, 3000 W; and a pressure, 25 Pa. Additionally, a taper angle θ at an edge portion of the insulating layer 109 is preferably more than 30° and 75° or less.

The gate insulating film 105 is etched to form an opening portion that reaches a source region or a drain region. The opening portion may be formed by etching the insulating film 108 and the gate insulating film 105 by using a mask which is newly formed after etching the insulating layer 109 or by using the etched insulating layer 109 as a mask. The gate insulating film 105 is etched by using $CHF_3$ and Ar as an etching gas. By the etching step under such conditions, the contact hole that has a surface with few projections and has a high planarization rate can be obtained while reducing etching residues. It is to be noted that the etching time may be increased at the rate of approximately from 10% to 20% to perform the etching while further reducing residues on the semiconductor layer.

A conductive film is formed and etched to form an electrode layer 112 that is electrically connected to each impurity region. The electrode layer 112 is a wiring which is in contact with a first electrode of a light emitting element to be formed later, and electrically connects a thin film transistor to the light emitting element. The electrode layer 112 functions also as a source electrode or a drain electrode. For the conductive film, a film formed of an element of aluminum (Al), titanium (Ti), molybdenum (Mo), tungsten (W) and silicon (Si) may be used as well as an alloy film using these elements. In this embodiment mode, Ti/TiN/Al/TiN are laminated so as to have a thickness of 60 nm/40 nm/350 nm/100 nm, respectively, and then patterned to have a desired shape, thereby forming the electrode layer 112. Note that TiN is one of the materials having excellent adhesiveness with an insulating layer. Therefore, a film is not easily peeled. When the above-mentioned structure is employed, TiN functions also as a barrier layer in which Al is hardly diffused. In addition, TiN preferably contains N with concentrations of 44 atomic % or less in order to form a contact with the source region or the drain region of the TFT. More preferably, the concentration of N in TiN is in the range between 7 atomic % and 44 atomic %. The conductive film may have a two-layer structure of TiN/Al, leading to simplification of the manufacturing step.

Etching is carried out by ICP (Inductively Coupled Plasma) etching method using $BCl_3$ and $Cl_2$. Etching conditions are such that the amount of electric power applied to a coiled electrode is 450 W; the amount of electric power applied to an electrode on the substrate side is 100 W; and a pressure is 1.9 Pa.

In addition, the insulating layer in a terminal portion is simultaneously removed by etching during patterning of the insulating film 108 and the insulating layers 109, and thus, the conductive layers 180 and 181 are exposed. A wiring layer 184 is simultaneously formed from the same material in a step of forming the electrode layer 112 in this embodiment mode. When the outside end faces of the insulating film 108 and the insulating layer 109 are formed to have inclination (a taper shape), the coverage of the wiring layer 184 is improved. A taper angle thereof is preferably more than 30° and less than 70°.

Through the above-mentioned steps, an (active matrix) element substrate provided with a TFTs 150, 165 and 175 is completed. In this embodiment mode, only the p-channel type TFT is shown in a pixel region, however, it may have an n-channel type TFT. Alternatively, the TFT may be a single-gate structure in which one channel-formation region is formed, a double-gate structure in which two channel-formation regions are formed, or a triple-gate structure in which three channel-formation regions are formed. In addition, the TFT in a driver circuit portion may be a single-gate structure, a double-gate structure or a triple-gate structure, too.

Note that a method for manufacturing a TFT is not limited to the one shown in this embodiment mode, and the invention is also applicable to a top gate type (a planar type), a bottom gate type (an inverse stagger type), a dual-gate type having two gate electrodes disposed over and below a channel region with a gate insulating film therebetween, or other structures.

Next, a first electrode (also referred to as a pixel electrode) 113 is formed to be in contact with the electrode layer 112. The first electrode functions as an anode or a cathode, and a film containing an element of Ti, TiN, $TiSi_xN_y$, Ni, W, $WSi_x$, $WN_x$, $WSi_xN_y$, NbN, Cr, Pt, Zn, Sn, In, and Mo or a film including an alloy material or a compound material containing the elements as the main component or a laminated film thereof may be used with film thicknesses ranging from 100 nm to 800 rum in total.

The first electrode 113 has light-transmitting properties since the display device has a structure in which a light emitting element is used as a display element and light from the light emitting element is extracted from the side of the first electrode in this embodiment mode. The first electrode 113 is formed by forming a transparent conductive film and etching to have a desired shape (see FIG. 1C). As the first electrode 113 used in the invention, indium tin oxide containing silicon oxide (hereinafter, referred to as "ITSO"), zinc oxide, tin oxide, indium oxide or the like can be used as long as a material is not crystallized at a heat treatment temperature for performing dehydration treatment. In addition, a transparent conductive film such as an indium oxide zinc oxide alloy in which 2 wt. % to 20 wt. % of zinc oxide (ZnO) is mixed into indium oxide can be used as the first electrode 113. In addition to the above-mentioned transparent conductive film, a titanium nitride film or a titanium film may be used as the first electrode 113. In this case, the titanium nitride film or the titanium film is formed in a film thickness that transmits light (preferably, approximately from 5 nm to 30 nm) after forming the transparent conductive film. In this embodiment mode, as the first electrode 113, indium tin oxide is used as a conductive material, and IFSO using silicon oxide is used as a material for the prevention of crystallization. In this embodiment mode, an ITSO film is formed by using a target in which from 1% to 10% of silicon oxide ($SiO_2$) is added to indium tin oxide, and setting a flow rate of Ar gas to be 120 sccm; a flow rate of $O_2$ gas, 5 sccm; a pressure, 0.25 Pa; an electric power, 3.2 kW with the use of a sputtering method to have a film thickness of 110 nm. The first electrode 113 may be cleaned or polished with a CMP method and a polyvinyl alcohol-based porous material so that the surface thereof is planarized. In addition, after polishing using a CMP method, ultraviolet ray irradiation, oxygen plasma treatment, or the like may be carried out on the surface of the first electrode 113.

Figure 1D:
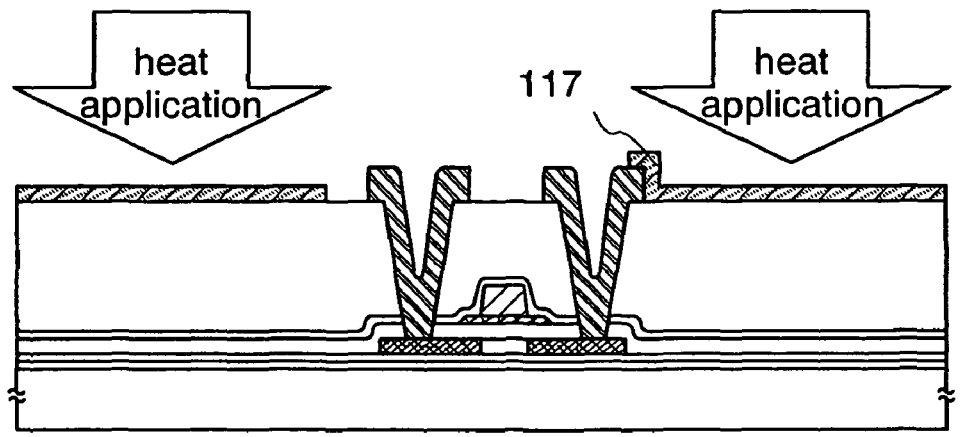

In the invention, heat treatment is performed as shown in FIG. 1D after forming the first electrode 113. According to the heat treatment, moisture included in the first electrode is released. Accordingly, degasification or the like is not generated from the first electrode. Even when a light emitting material which is easily deteriorated by moisture is formed over the first electrode, the light emitting material is not deteriorated; therefore, a highly reliable display device can be manufactured. In this embodiment mode, ITSO is used for the first electrode, and it remains an amorphous state even when baking is performed unlike ITO which is crystallized by being baked. Hence, ITSO has higher planarity than ITO and short-circuit with a cathode is not easily generated even when a layer containing an organic compound is thin.

The heat treatment can be combined with a step of hydrogenating the semiconductor layer. This hydrogenation is a step for terminating a dangling bond in the semiconductor layer with the use of hydrogen contained in the insulating film 108, and effective in improving TFT characteristics. According to the invention, dehydration treatment of the electrode for the prevention of degasification, and hydrogenation of a semiconductor layer of a thin film transistor can be simultaneously performed in one heat step; therefore, reliability can be enhanced without increasing the number of steps. The heat step is performed under a reduced pressure at temperatures of 350° C. or higher. Preferably, the heat step is performed under a reduced pressure at temperatures of 375° C. or higher for 12 hours or longer. The heat temperature is a temperature at which the first electrode is not crystallized. Pressure is preferably from $1 \times 10^{-6}$ Pa to $1 \times 10^{-2}$ Pa. The temperature is a substrate temperature at which the first electrode is formed. In this embodiment mode, heat treatment is performed under a reduced pressure of $3 \times 10^{-4}$ Pa, at a substrate temperature of 410° C. for 12 hours. According to the heat treatment, a first electrode 117 is formed. The first electrode 117 has reduced inside moisture content, thereby not generating degasification inside the device.

Then, an insulating layer (insulator) 114 (referred to as a bank, a partition wall, a mound, or the like) which covers an end portion of the first electrode 113 and the electrode layer 112 is formed. As the insulating layer 114, an SOG film obtained by an application method (for example, an SiOx film containing an alkyl group) is used within the range of film thicknesses of from 0.8 μm to 1 μm. Either dry etching or wet etching can be used for etching. Here, the insulating layer 114 is formed by dry etching with the use of a mixed gas of $CF_4$, $O_2$ and He (see FIG. 2A). The dry etching is performed by setting a pressure at 5 Pa; a power, 1500 W; a flow rate of $CF_4$, 25 sccm; a flow rate of $O_2$, 25 sccm; and a flow rate of He, 50 sccm. In the dry etching, the etching rate of the SiOx film containing an alkyl group is from 500 nm/min to 600 nm/min. On the other hand, the etching rate of the ITSO film is 10 nm/min or less; therefore, a sufficient selective ratio can be obtained. The TiN film which has preferable adhesiveness is the outermost surface since the electrode layer 112 is covered with the insulating layer 114 including the SiOx film containing an alkyl group. As the insulating layer 114, in addition to an insulating film in which a skeleton is configured by the bond of silicon (Si) and oxygen (O), a film including one kind or plural kinds of an inorganic material (silicon oxide, silicon nitride, silicon oxynitride, silicon nitride oxide, or the like), a photosensitive or non-photosensitive organic material (an organic resin material) (a resist material such as polyimide, acrylic, polyamide, polyimidamide, benzocyclobutene), or a Low k material having low dielectric constant and the like, or a lamination layer of these films can be used as long as the films have high heat resistance and preferable planarity. When the same material is used for the insulating layer 109 which is an interlayer insulating film and the insulating layer 114 which is a partition wall, manufacturing cost can be reduced. Additionally, the cost can be reduced by using a common apparatus such as a film formation application apparatus and an etching apparatus.

It is preferable to further perform deaeration by carrying out vacuum heating before forming a light emitting layer (a layer including an organic compound) 119 to further improve reliability. For example, it is desirable to perform heat treatment at from 200° C. to 300° C. under a reduced pressure atmosphere or inert atmosphere before evaporating an organic compound material. According to the heat treatment, moisture contained in or adhering a conductive film which is to be the first electrode or the insulating layer (the partition wall) can be released. The heat treatment can be combined with the above-mentioned heat treatment when vacuum is kept and the substrate can be transferred within a vacuum chamber, and the above-mentioned heat treatment may be performed once after forming the insulating layer (the partition wall). Here, the interlayer insulating film and the insulating layer (the partition wall) are formed of an SiOx films having high heat resistance; therefore, there is no problem even when high heat treatment is carried out. Accordingly, a step for enhancing reliability by heat treatment can be sufficiently performed.

In this invention, a light emitting element formed of an EL material (also refereed to as an "EL element") is used as a display element of a display device. It is said that an EL element emits light through the following mechanism: a voltage is applied between a pair of electrodes that sandwich an organic compound layer, electrons injected from a cathode and holes injected from an anode are re-combined at the luminescent center of the organic compound layer to form molecular excitons, and the molecular excitons return to a ground state while releasing energy to cause the EL element to emit light. An excitation state includes a singlet excitation state and a triplet excitation state, and it is considered that luminescence can be made through either excitation state.

A light emitting layer 119 is formed over the first electrode 117. Note that although only one pixel is shown in FIG. 5, light emitting layers corresponding to each color of R (red), G (green) and B (blue) are separately formed in this embodiment mode. In this embodiment mode, as the light emitting layer 119, materials which show luminescence of each color of red (R), green (G) and blue (B), are selectively formed by a vapor deposition method using a vapor-deposition mask for each, or the like. The materials, which show luminescence of each color red (R), green (G) and blue (B), can be also formed by a droplet discharge method (a low molecular or high molecular weight materials or the like) and, in this case, separate coating of RGB can be carried out without using a mask, which is preferable. In addition, each luminescence may be luminescence returning from a singlet excitation state to a ground state (fluorescence), may be luminescence returning from a triplet excitation state to a ground state (phosphorescence), or may have combination in which one color is fluorescence (or phosphorescence) and the other two colors are phosphorescence (or fluorescence). Phosphorescence may be used only for R and fluorescence may be used for G and B. Specifically, a laminated structure in which a copper phthalocyanine (CuPc) film having a 20 nm film thickness is provided as a hole injection layer and tris-8-quinolinolatoaluminum complex ($Alq_3$) film having a 70 nm film thickness is provided thereover as a light emitting layer may be also applied. A luminescent color can be controlled by adding a fluorescent dye such as quinacridon, perylene or DCM1 into $Alq_3$.

However, the above-mentioned example is one example of an organic light emitting material that can be used as a light emitting layer, and there is no necessity at all to be limited thereto. A light emitting layer (a layer to emit luminescence and to move a carrier for it) may be formed by arbitrarily combining a light emitting layer, a charge transport layer or a charge injection layer. For example, an example in which a low molecular weight organic light emitting material is used as a light emitting layer is shown in this embodiment mode, however, an intermediate molecular weight organic light emitting material or a high molecular weight organic light emitting material may be used. Throughout this specification, an organic light emitting material which does not sublimate and has 20 or less molecules or has a chained molecule length of 10 μm or less is defined as the intermediate molecular weight organic light emitting material. In addition, as an example of using a high molecular weight organic light emitting material, a laminated structure having a polythiophene (PEDOT) film provided by spin coating with a film thickness of 20 nm as the hole injection layer and a paraphenylenevinylene (PPV) film with a thickness of approximately 100 nm provided thereover as the light emitting layer may be given. In addition, emission wavelength can be selected from red through blue by using π-conjugated polymer of PPV. An inorganic material such as silicon carbide can be used for the charge transport layer or the charge injection layer. Known materials can be used for the organic light emitting materials and inorganic materials.

Specifically, the above-mentioned CuPc or PEDOT is used as the hole injection layer; α-NPD, a hole transport layer; BCP or $Alq_3$, an electron transport layer; and BCP: Li or $CaF_2$, an electron injection layer are used each. When light-transmitting ITO or ITSO is used for a second electrode in the case of a dual emission type or a top emission type like in this embodiment mode, BzOS—Li in which Li is added into a benzoxazole derivative (BzOS), or the like can be used. In addition, $Alq_3$ doped with dopant corresponding to each luminescent color of R, G and B (DCM or the like in the case of R and DMQD or the like in the case of G) may be used for, for example, EML.

As the light emitting layer, hole injectability can be improved by carrying out co-evaporation on oxide such as molybdenum oxide (MoOx: X=2 to 3) or the like and α-NPD or rubrene instead of CuPc or PEDOT. In such a way, an organic material (containing a low molecular weight or high molecular weight material) or a composite material of an organic material and an inorganic material can be used for the material of the light emitting layer.

In addition, although not shown, a color filter may be formed in an opposite substrate. The color filter can be formed by a droplet discharge method or a vapor deposition method. High-definition display can be also carried out with the use of a color filter. It is because emission spectrums of each RGB can be compensated so that a broad peak becomes sharp by using the color filter.

As mentioned above, the case of forming the materials showing luminescence of each RGB is explained, however, full color display can be performed by forming materials showing monochromatic luminescence to be combined with a color filter and a color conversion layer. For example, in the case of forming an electroluminescent layer showing luminescence of white or orange, full color display can be achieved by separately providing a color filter, a color conversion layer, or a color filter combined with a color conversion layer. A color filter and a color conversion layer may be provided for, for example, a second substrate (a sealing substrate) and may be attached to the substrate. As mentioned above, any one of materials showing monochromatic luminescence, a color filter, or a color conversion layer can be formed by a droplet discharge method.

Of course, monochromatic luminescence display may be carried out. For example, an area color type display device may be formed by using monochromatic luminescence. A passive matrix type display portion is suitable for the area color type and can mainly display characters or symbols.

Next, a second electrode 120 formed of a conductive film is provided over the light emitting layer 119. As the second electrode 120, a material with a low work function (Al, Ag, Li, Ca, or an alloy thereof, MgAg, MgIn, AlLi, $CaF_2$, or CaN) may be used.

Figure 2A:
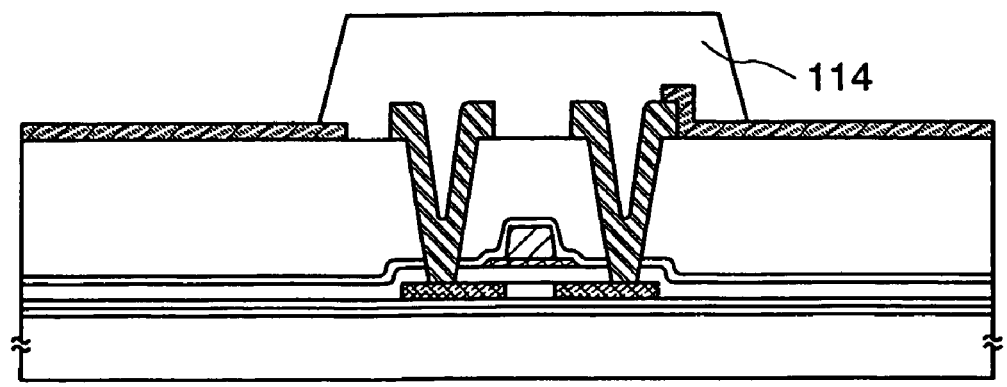
FIGS. 2A and 2B show views describing a method for manufacturing a display device according to a certain aspect of the invention.
Figure 2B:
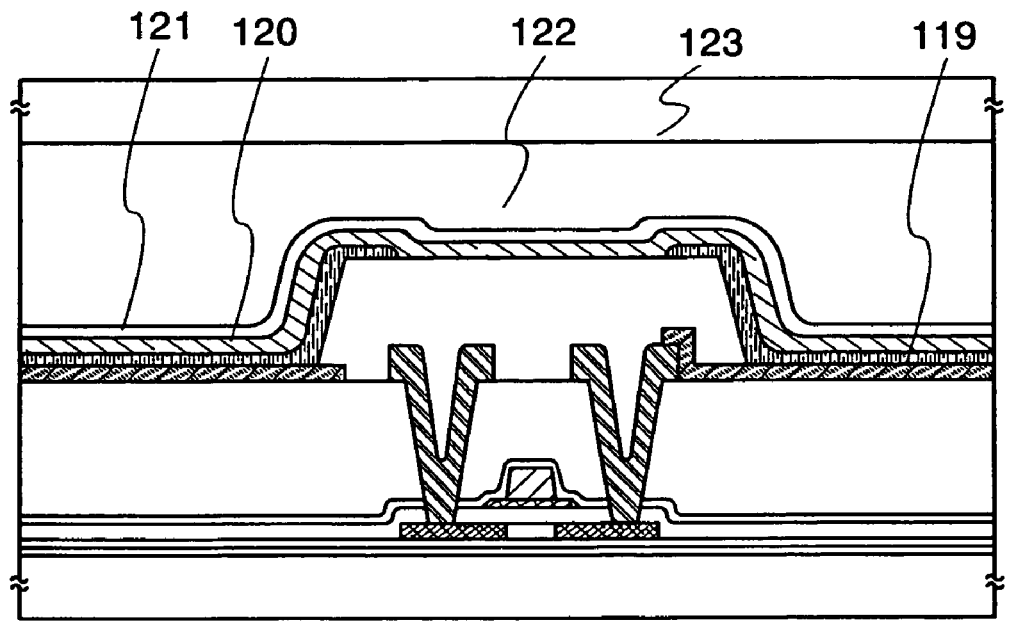

In display devices according to this embodiment mode shown in FIGS. 2B and 5, light emitted from a light emitting element is emitted by transmitting through the side of the first electrode 117.

Although not shown, it is effective to provide a passivation film so as to cover the second electrode 120. The passivation film is formed of an insulating film containing silicon nitride, silicon oxide, silicon oxynitride (SiON), silicon nitride oxide (SiNO), aluminum nitride (AlN), aluminum oxynitride (AlON), aluminum nitride oxide (AlNO) of which nitrogen content is higher than oxygen content, aluminum oxide, diamond like carbon (DLC), or a carbon film containing nitrogen (CN), and a single layer of the insulating film or the lamination combining them can be used. In addition, a material, in which a skeleton is configured by the bond of silicon (Si) and oxygen (O), and which at least contains hydrogen as a substituent or which includes at least one kind of fluorine, an alkyl group, and aromatic hydrocarbon as the substituent may be used.

In this case, it is preferable to use a film with satisfactory coverage as the passivation film, and a carbon film, a DLC film, in particular, is effective to be used. Since a DLC film can be formed at temperatures ranging from a room temperature to 100° C. or less, it can be easily formed even over the light emitting layer 119 with low heat resistance. A DLC film can be formed by a plasma CVD method (typically, an RF plasma CVD method, a microwave CVD method, an electron cyclotron resonance (ECR) CVD method, a hot-filament CVD method, or the like), a combustion flame method, a sputtering method, an ion beam vapor deposition method, a laser vapor deposition method, or the like. As a reactive gas to be used for deposition, a hydrogen gas and a hydrocarbon-based gas (for example, $CH_4$, $C_2H_2$, $C_6H_6$ or the like) is used and ionized by glow discharge, and then deposition is carried out with accelerative collision of ion with a cathode to which a negative self-bias is applied. In addition, the CN film may be formed by using $C_2H_4$ gas and $N_2$ gas as a reactive gas. A DLC film has high blocking effect to oxygen and thus can control oxidation of the light emitting layer 119. Therefore, a problem that the light emitting layer 119 oxidizes can be prevented during a subsequent sealing step.

The light emitting element is sealed by bonding the substrate 100 where the light emitting element is formed in such a manner to a sealing substrate 123 with a sealant 125. Moisture is prevented from entering through a cross-section by the sealant; therefore, the light emitting element is prevented from deteriorating, which leads to the higher reliability of a display device. As the sealant, a visible light curing, ultraviolet curing or heat curing resin is preferably used. For example, an epoxy resin such as a bisphenol A type liquid resin, a bisphenol A type solid resin, a resin containing bromo-epoxy, a bisphenol F type resin, a bisphenol AD type resin, a phenol type resin, a cresol type resin, a novolac type resin, a cyclic aliphatic epoxy resin, an epibis type epoxy resin, a glycidyl ester resin, a glycidyl amine resin, a heterocyclic epoxy resin, or a modified epoxy resin can be used. Note that a filler may be filled in a region surrounded with the sealant, and nitrogen or the like may be filled by sealing the light emitting element under a nitrogen atmosphere. The filler does not necessarily have light-transmitting properties, since a bottom emission type is employed in this embodiment mode. In the case of a structure in which light is extracted by transmitting the filler 122, the filler needs to have light-transmitting properties. Typically, a visible light curing, ultraviolet curing, or heat curing epoxy resin may be used. As the sealing substrate 123, a glass substrate, a quartz substrate, a silicon substrate, a metal substrate, or a stainless substrate over which an insulating film is formed may be used. Alternatively, a plastic substrate having a heat resistance that can withstand a processing temperature of this embodiment mode may be used, or a flexible substrate or a cover member such as a film may be used.

In this embodiment mode, a terminal portion has a structure electrically connected to exterior by connecting an FPC 183 to conductive layers 180 and 181 which is to be a terminal electrode by an anisotropic conductive layer 182.

In this embodiment mode, a display device is formed of the above-mentioned circuits. However, the invention is not limited thereto, and either a passive matrix circuit or an active matrix circuit may be used. As a peripheral driver circuit, an IC chip may be mounted by the above-mentioned COG method or TAB method. Additionally, a single or a plurality of gate wiring driver circuits and source wiring driver circuits may be used.

In the display device of the invention, a method for driving a screen is not specifically limited, and a dot sequential driving system, a line sequential driving system, a plane sequential driving system, or the like may be employed. Typically, the line sequential driving system is employed, and a time division gradation driving system or an area gradation driving system may be utilized as needed. The video signal to be inputted into a source wiring of the display device may be either an analogue signal or a digital signal, and the driver circuit may be designed corresponding to the video signal as needed.

Further, in a display device using a digital video signal, there are two kinds of driving systems in which video signals inputted into a pixel are ones with constant voltage (CV) and in which video signals inputted into a pixel are ones with constant current (CC). Further, as for the driving system using video signals with constant voltage (CV), there are two kinds of systems in which voltage applied to a light emitting element is constant (CVCV), and in which current applied to a light emitting element is constant (CVCC). In addition, as for the driving system using video signals with constant current (CC), there are two kinds of systems in which voltage applied to a light emitting element is constant (CCCV), and in which current applied to a light emitting element is constant (CCCC).

Through the above-mentioned steps, a display device in which degasification is not generated can be manufactured without increasing the number of steps; therefore, a light emitting element can be prevented from deteriorating. Hence, a highly reliable display device which can display a high-definition and high-quality image can be manufactured with a preferable yield.

Embodiment Mode 2

In this embodiment mode, an example of a display device according to the present invention in which a connection structure of a first electrode and a wiring is different is described with reference to FIGS. 3A to 3D, and 4A and 4B.

As shown in Embodiment Mode 1, base films 101a and 101b are formed over a substrate 100, and a semiconductor layer 102 having impurity regions 103 and 104 is formed. Conductive layers 106 and 107 which are gate electrodes are formed over the semiconductor layer 102 with a gate insulating film 105 therebetween, and an insulating film 108 is formed as a passivation film. Then, an insulating layer 109 is formed as an interlayer film (see FIG. 3A). In this embodiment mode, an insulating layer in which a skeleton is configured by the bond of silicon (Si) and oxygen (O) is used as the insulating layer 109.

In this embodiment mode, a first electrode 113 is selectively formed over the insulating layer 109 before forming an electrode layer 112. In this case, a structure in which the electrode layer 112 is laminated over the first electrode. When the first electrode 113 is formed before forming the electrode layer 112, the first electrode 113 can be formed over a flat region; therefore, it can be formed with preferable planarity since it has favorable coverage and deposition properties, and polishing treatment such as CMP can be sufficiently performed. Additionally, there is an effect that the steps can be simplified since the first electrode 113 functions as an etching stopper at the time of patterning the electrode layer 112; therefore, an etching stopper layer is not necessarily provided separately.

Figure 3A:
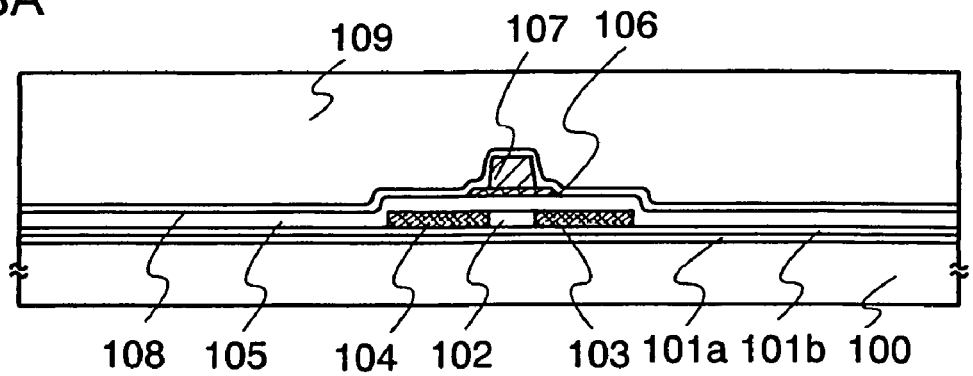
FIGS. 3A to 3D show views describing a method for manufacturing a display device according to a certain aspect of the invention.
Figure 3B:
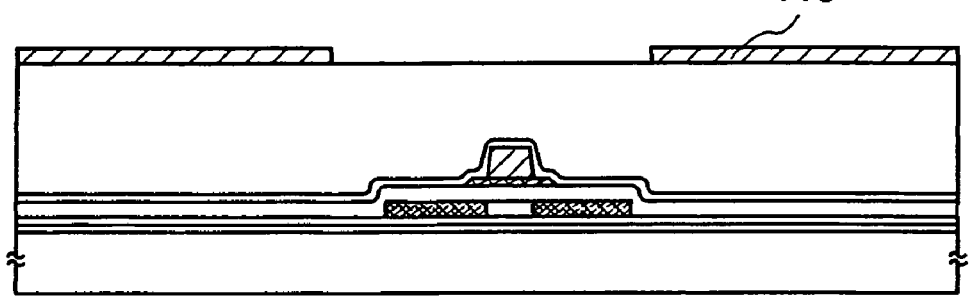
Figure 3C:
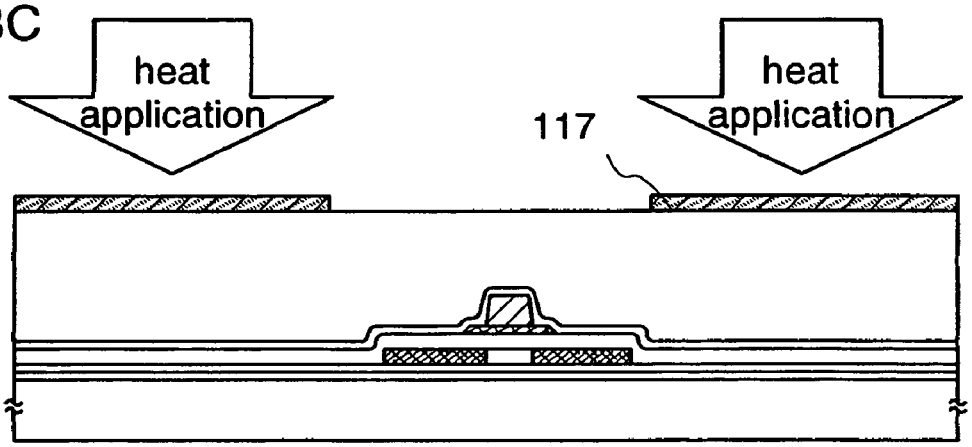
Figure 3D:
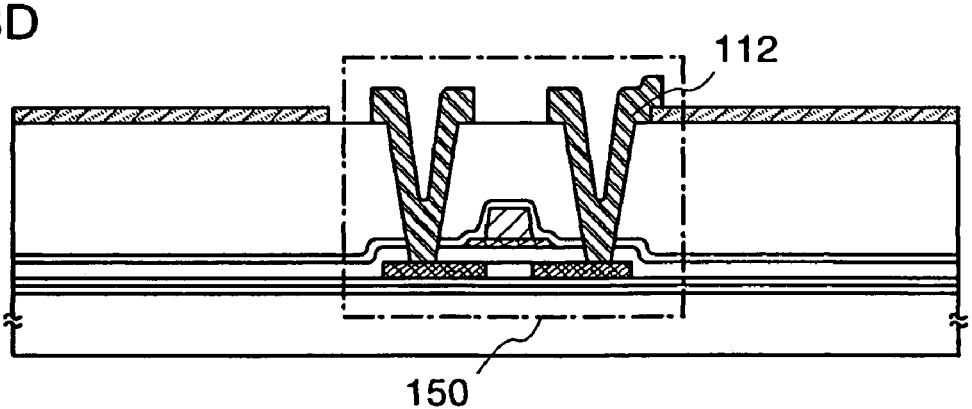
Figure 4A:
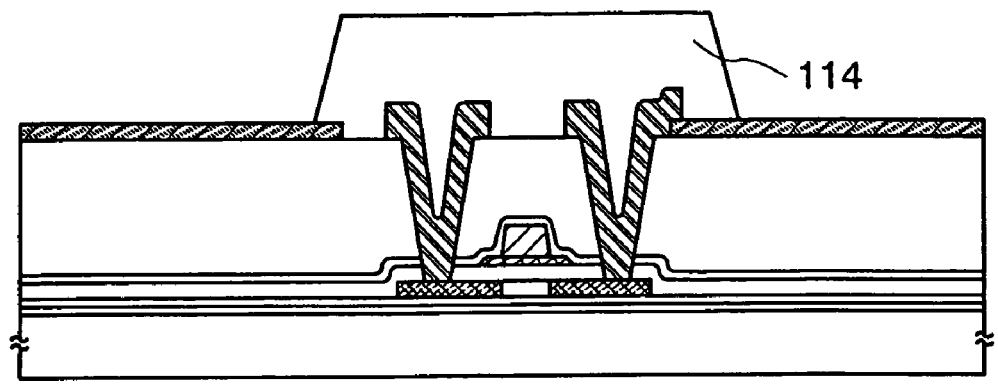
FIGS. 4A and 4B show views describing a method for manufacturing a display device according to a certain aspect of the invention.
Figure 4B:
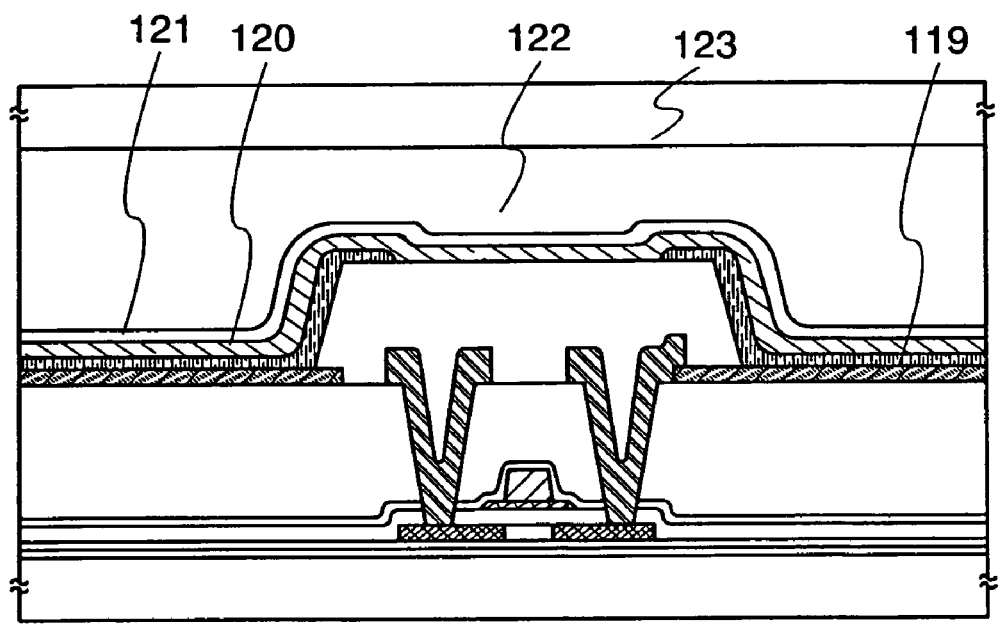

The first electrode 113 is selectively formed over the insulating layer 109. Afterwards, a heat treatment step is performed. In this embodiment mode, heat treatment is carried out as shown in FIG. 3C after forming the first electrode 113. According to the heat treatment, moisture contained in the first electrode is released. Hence, degasification or the like is not generated from the first electrode; therefore, a highly reliable display device can be manufactured even when a light emitting material which is easily deteriorated due to moisture is formed over the first electrode, which does not cause the light emitting material to deteriorate. Note that the first electrode includes a conductive material added with a material which prevents crystallization. In this embodiment mode, ITSO is used for the first electrode, which does not cause the electrode to crystallize as ITO and remains an amorphous state. Therefore, ITSO has higher planarity than ITO and is less likely to generate a short-circuit with a cathode even when a layer containing an organic compound is thin.

This heat treatment can be combined with a step of hydrogenating the semiconductor layer. This is a step for terminating a dangling bond in the semiconductor layer with the use of hydrogen contained in the insulating film 108. According to the invention, dehydration treatment of the electrode for the prevention of degasification, and hydrogenation of a semiconductor layer of a thin film transistor can be simultaneously performed; therefore, reliability can be enhanced without increasing the number of steps. This heat step is performed under a reduced pressure at temperatures of 350° C. or higher. Preferably, the heat step is performed under a reduced pressure at temperatures of 375° C. or higher for 12 hours or longer. The heat temperature is set at a temperature at which the first electrode is not crystallized. Pressures are preferably from $1\times10^{-6}$ Pa to $1\times10^{-2}$ Pa. The temperature is equal to a substrate temperature at which the first electrode is formed. In this embodiment mode, heat treatment is performed under a reduced pressure of $3\times10^{-4}$ Pa at a substrate temperature of 410° C. for 12 hours. According to this heat treatment, a first electrode 117 is formed. The first electrode 117 has reduced inside moisture content by the heat treatment, thereby not generating degasification inside the device.

After the heat treatment, the insulating layer 109, the insulating film 108, the gate insulating film 105 are removed to form an opening portion (a contact hole) which reaches the semiconductor layer 102. The opening portion in the insulating layer may be formed before the heat treatment. The electrode layer 112 is formed in the opening portion to be in contact with the first electrode 117 (see FIG. 3D). Through the above-mentioned steps, a TFT 150 is formed.

As Embodiment Mode 1, an insulating layer 114 which is to be a partition wall covering an end portion of the first electrode 117 and the TFT 150 is formed, and a light emitting layer 119 including a light emitting material and a second electrode 120 are laminated. A protective film 121 is formed so as to cover the second electrode 120, and the substrate 100 and a sealing substrate 123 are bonded by being attached with a sealant. In this embodiment mode, a filler 122 is filled. Although not shown in this embodiment mode, a drying agent may be provided in a display device to further remove moisture. An installation location and method are not limited, and for example, a drying agent may be provided in a place where a depression is formed in the sealing substrate 123, or a depression may be filled with a resin or the like having hygroscopic properties in stead of the filler. When the depression is formed in a place which is not related to luminescence such as a peripheral driver circuit portion, the upper portion of the wiring layer or a sealant portion in the substrate 123, light extraction efficiency is not deteriorated.

Through the above-mentioned steps, a display device in which degasification is not generated can be manufactured without increasing the number of steps; therefore, a light emitting element can be prevented from deteriorating. Hence, a highly reliable display device which can display a high-definition and high-quality image can be manufactured with a preferable yield.

Embodiment Mode 3

In this embodiment mode, in a display device manufactured according to Embodiment Mode 1, examples of a dual emission type, a top emission type which is a one-side emission type are described with reference to FIGS. 6 and 7.

Figure 6:
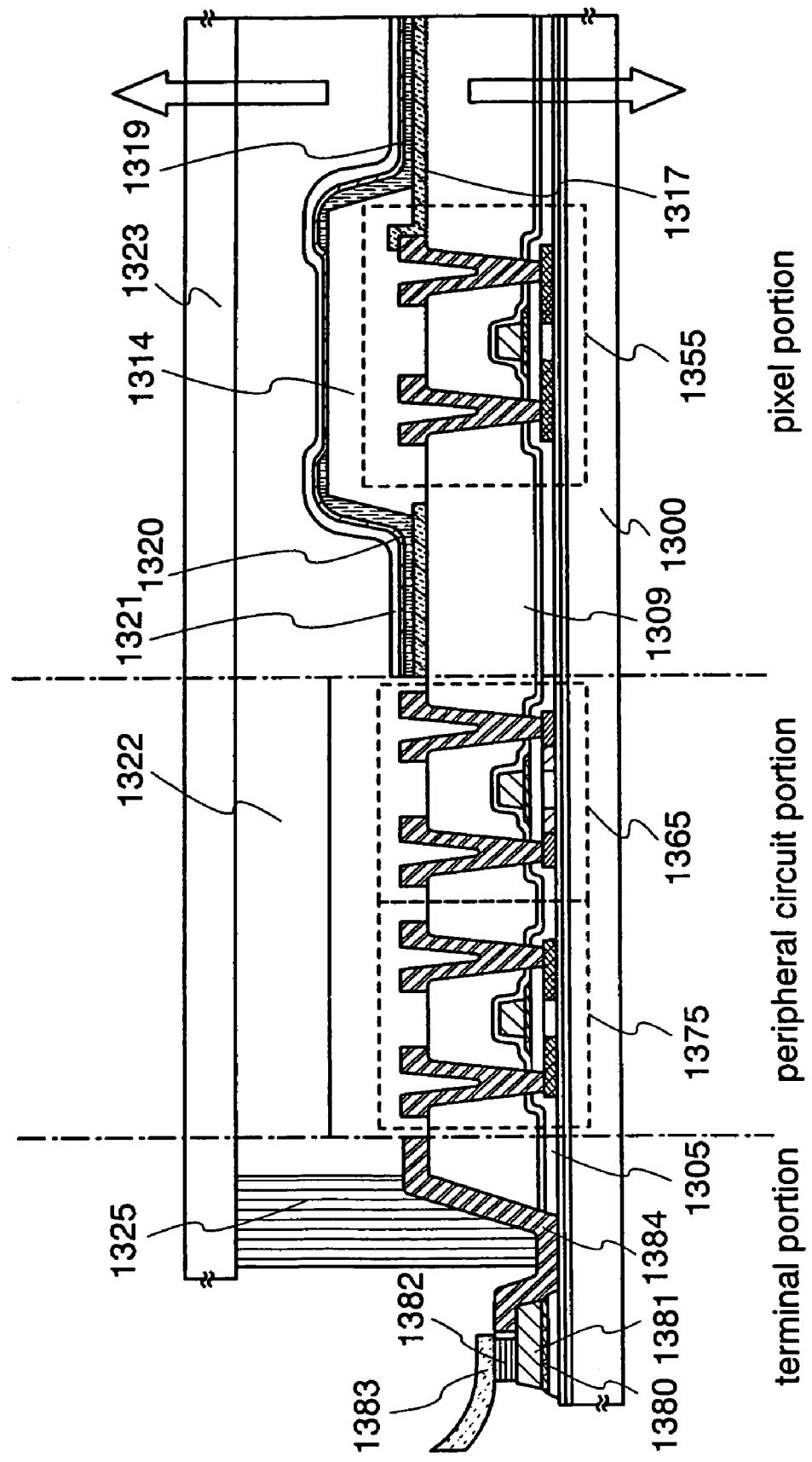
FIG. 6 shows a view describing a display device according to a certain aspect of the invention.

In FIG. 6, reference numeral 1300 denotes an element substrate; 1355, 1365 and 1375, TFTs; 1317, a first electrode; 1319, a light emitting layer; 1320, a second electrode; 1321, a transparent conductive film; 1322, a filler; 1325, a sealant; 1305, a gate insulating film; 1309, an insulating layer; 1314, a partition wall; 1323, a sealing substrate; 1384, a wiring layer; 1380 and 1381, terminal electrodes; 1382, an anisotropy conductive layer; and 1383, an FPC.

A display device shown in FIG. 6 is a dual emission type, and has a structure in which light is emitted in directions indicated by arrows, namely, to the both sides of the element substrate 1300 and the sealing substrate 1323. In this embodiment mode, a transparent conductive film is formed and etched to have a desired shape to form the first electrode 1317. Afterwards, heat treatment is carried out according to the present invention to form the first electrode 1317 which does not generate degasification. The transparent conductive film can be used as the first electrode 1317. In addition to the above-mentioned transparent conductive film, a titanium nitride film or a titanium film may be used as the first electrode 1317. In this case, a titanium nitride film or a titanium film is formed to have a film thickness in which light is transmitted (preferably, approximately from 5 nm to 30 nm) after forming the transparent conductive film. In this embodiment mode, ITSO is used as the first electrode 1317.

Then, a second electrode 1320 formed of a conductive film is formed over the light emitting layer 1319. As the second electrode 1320, a material having a low work function (Al, Ag, Li, Ca, or an alloy or a compound thereof: MgAg, MgIn, AlLi, $CaF_2$, or CaN) may be used. In the display device shown in FIG. 6, a lamination layer of a metal thin film in which a film thickness is thinned (MgAg: a film thickness of 10 nm) as the second electrode 1320, and ITSO having a film thickness of 100 nm as the transparent conductive film 1321 is used so that light is transmitted. As the transparent conductive film 1321, a film similar to the above-mentioned first electrode 1317 can be used.

Figure 7:
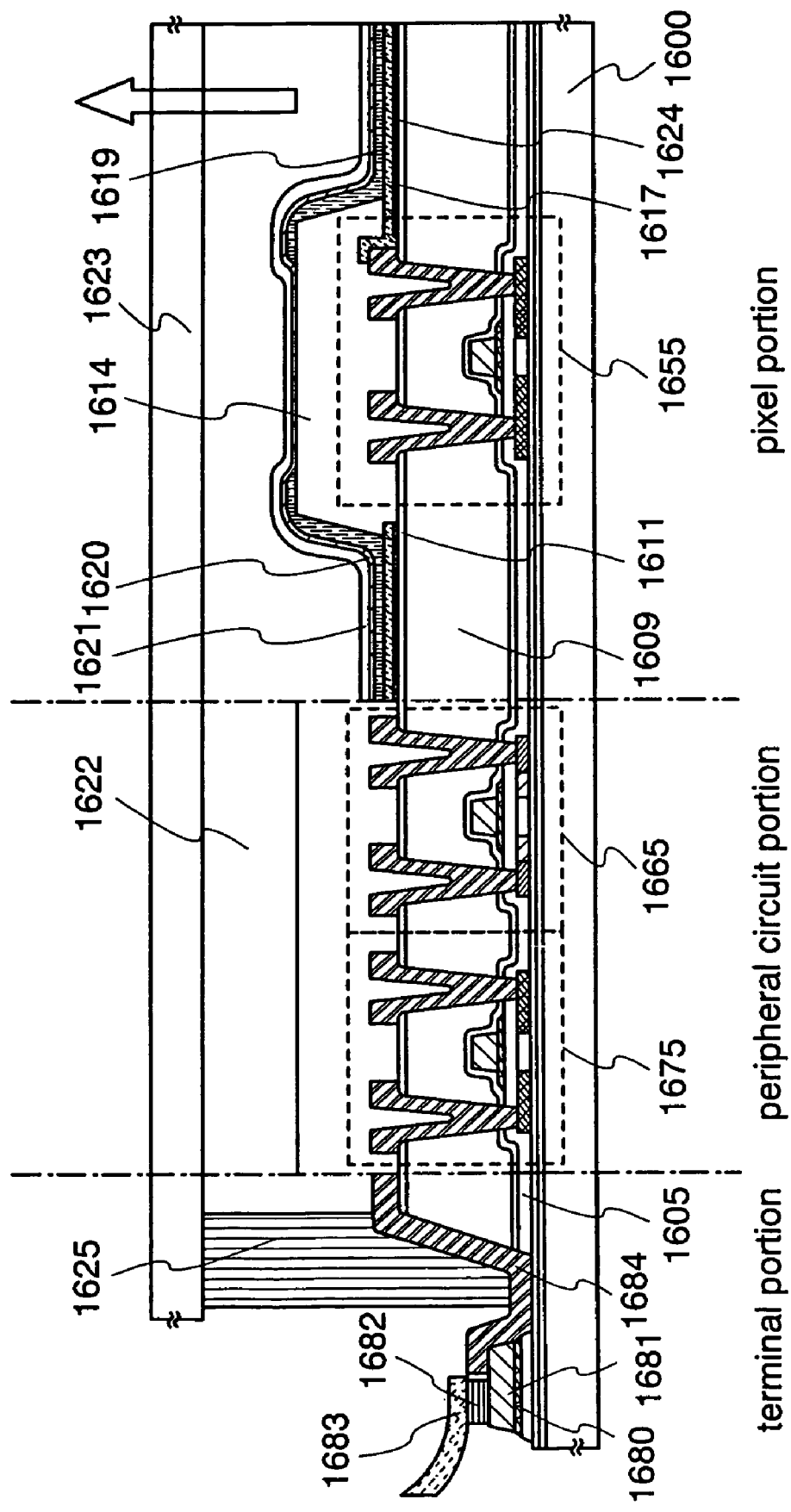
FIG. 7 shows a view describing a display device according to a certain aspect of the invention.

A display device shown in FIG. 7 is an one-side emission type, and has a structure in which top emission is performed in a direction indicated by an arrow. In FIG. 7, reference numeral 1600 denotes an element substrate; 1655, 1665 and 1675, TFTs; 1624, a metal film having reflectiveness; 1611, an insulating film; 1617, a first electrode; 1619, a light emitting layer; 1620, a second electrode; 1621, a transparent conductive film; 1622, a filler; 1625, a sealant; 1605, a gate insulating film; 1609, an insulating layer; 1614, a partition wall; 1623, a sealing substrate; 1684, a wiring layer; 1680 and 1681, terminal electrodes; 1682, an anisotropy conductive film; and 1683, an FPC. In this case, in the dual emission type display device shown in the above-mentioned FIG. 6, the metal film 1624 having reflectiveness is formed under the first electrode 1317. The first electrode 1617 which is a transparent conductive film functioning as an anode is formed over the metal film 1624 having reflectiveness. As the metal film 1624, it may at least have reflectiveness; therefore, Ta, W, Ti, Mo, Al, Cu or the like may be used. It is preferable to use a substance having high reflectiveness in a visible light region, and in this embodiment mode, a TiN film is used. In the invention, heat treatment is performed on the first electrode after it is formed; therefore, degasification is not generated in a device.

The display device shown in FIG. 7 is a top emission type display device in which light is extracted from the side of the sealing substrate 1623. Therefore, light extraction efficiency is not deteriorated even when the insulating film 1611 is formed. Accordingly, in this embodiment mode, the insulating film 1611 is formed over the insulating layer 1609 to be used as a base film of the first electrode 1617. The insulating film 1611 functions as an etching stopper at the time of patterning the electrode layer. By selecting materials for the electrode layer and the insulating film 1611 to have a high selective ratio each other, a state in which the surface of the insulating film 1611 has no residue and a preferable planarity can be obtained even after etching the electrode. When the insulating film 1611 has preferable planarity, disconnection, a short-circuit or the like can be prevented even when the first electrode 1617 is formed as a pixel electrode over the insulating film 1611, thereby enhancing the reliability of the display device.

The second electrode 1620 formed of a conductive film is provided over the light emitting layer 1619. As the second electrode 1620, a material having a low work function (Al, Ag, Li, Ca, or an alloy or a compound thereof: MgAg, MgIn, AlLi, $CaF_2$, or CaN) may be used. In this embodiment mode, a lamination layer of a metal thin film in which a film thickness is thinned (MgAg: a film thickness of 10 nm) so that light is transmitted as the second electrode 1620, and ITSO having a film thickness of 110 nm as the transparent conductive film 1621 is used.

Through the above-mentioned steps, a display device in which degasification is not generated can be manufactured without increasing the number of steps; therefore, a light emitting element can be prevented from deteriorating. Hence, a highly reliable display device which can display a high-definition and high-quality image can be manufactured with a preferable yield.

Embodiment Mode 4

Figure 8:
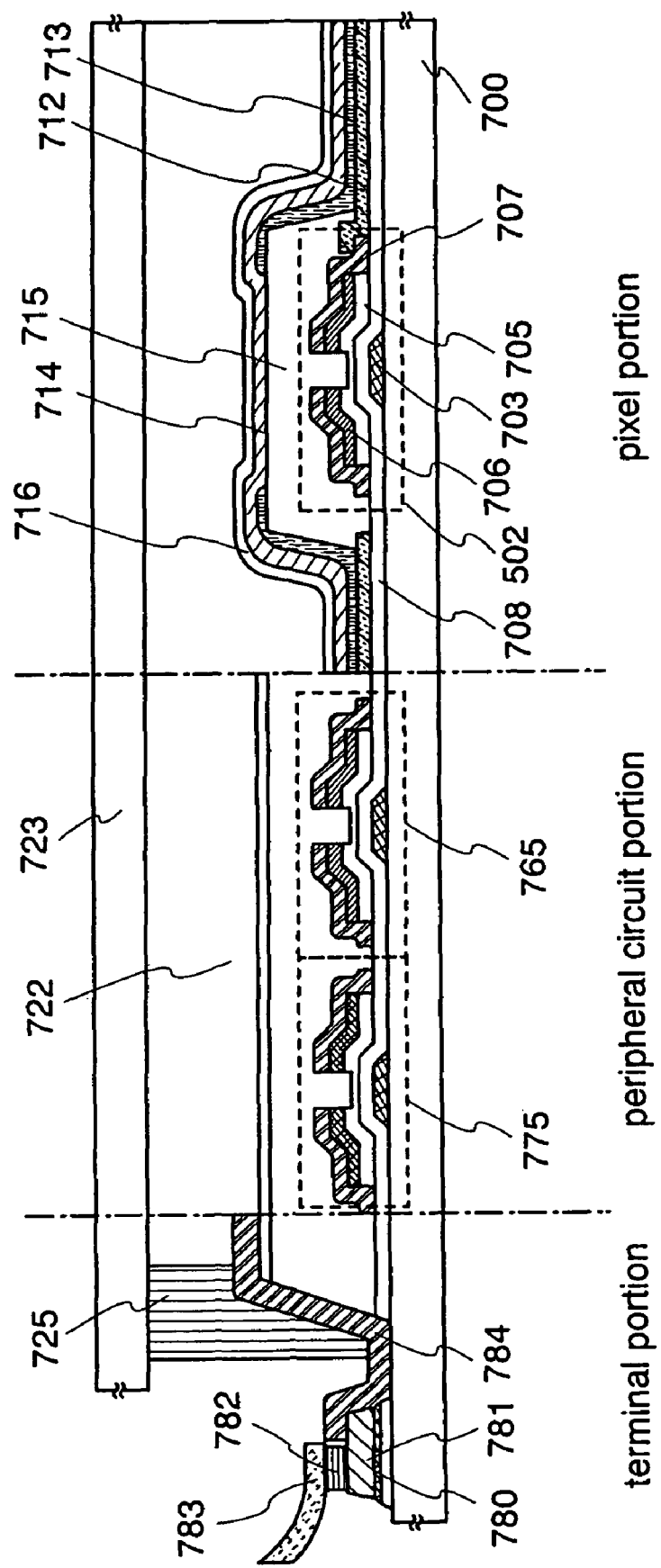
FIG. 8 shows a view describing a display device according to a certain aspect of the invention.
Figure 9:
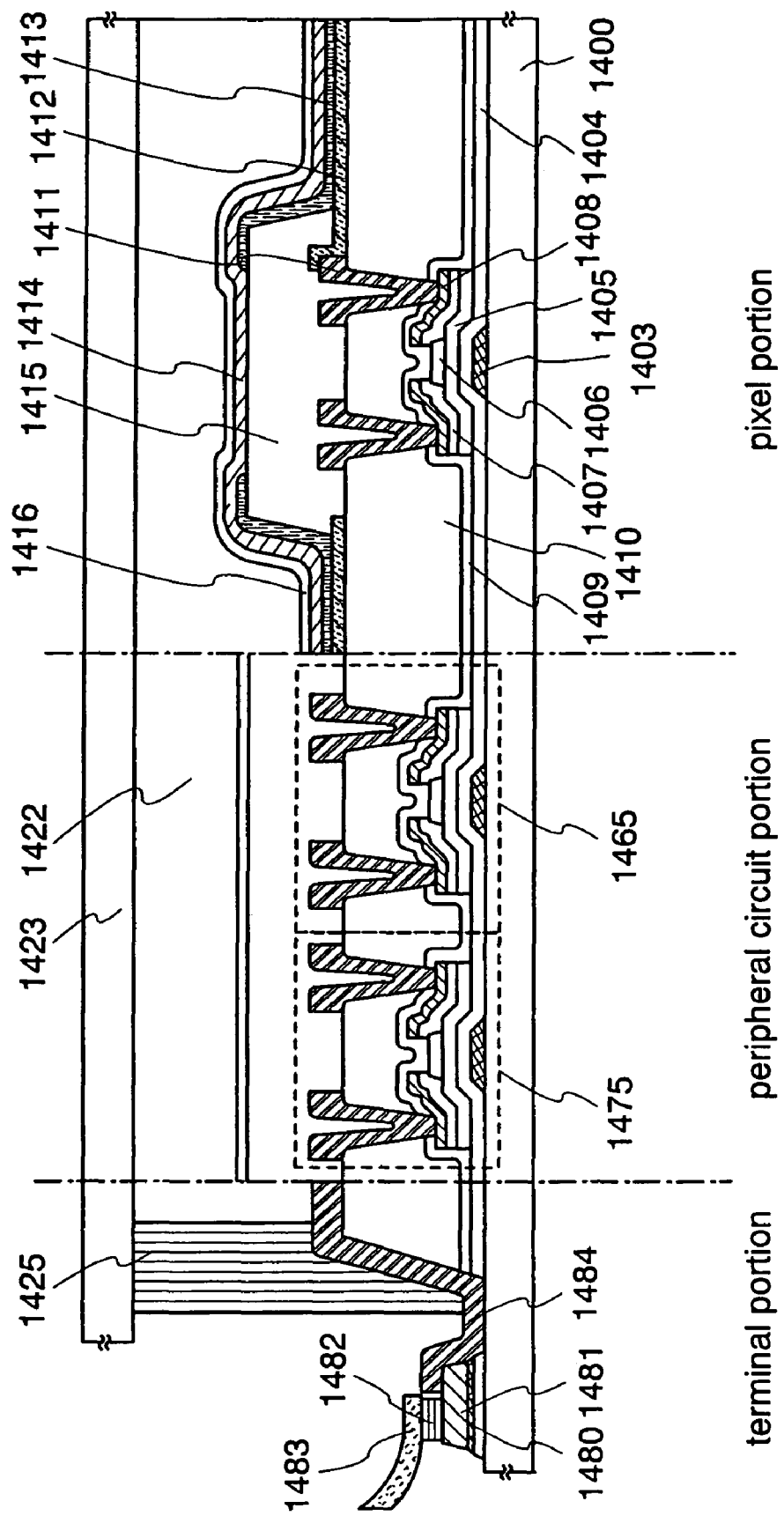
FIG. 9 shows a view describing a display device according to a certain aspect of the invention.

In this embodiment mode, an example of an inverse stagger type TFT is shown in FIGS. 8 and 9. A detailed description is omitted here since it is the same display device as shown in Embodiment Mode 1 in Embodiment Modes except for a TFT portion.

A TFT shown in FIG. 9 is a channel protective type. Reference numeral 1400 denotes an element substrate; and 1465 and 1475, TFTs of a driver circuit portion, and a gate insulating film 1404, a semiconductor layer 1405, an N-type semiconductor layer 1407 as a semiconductor layer having one conductivity type, and a metal layer 1408 are laminated over a gate electrode 1403, and a channel protective film 1406 and an electrode layer 1411 are formed over a portion which is to be a channel formation region of the semiconductor layer 1405. Reference numeral 1412 denotes a first electrode; 1413, a light emitting layer; 1414, a second electrode; 1416, a passivation film; 1425, a sealant; 1409 and 1410, insulating layers; 1415, a partition wall; 1423, a sealing substrate; 1484, a wiring layer; 1480 and 1481, terminal electrodes; 1482, an anisotropy conductive film; and 1483, an FPC. A display device according to this embodiment mode is filled with a resin-form filler 1422. However, the display device may be filled with nitrogen by conducting a sealing step under nitrogen atmosphere.

A TFT shown in FIG. 8 is a channel etch type. Reference numeral 700 denotes an element substrate; 765 and 775, TFTs of a driver circuit portion; and a gate insulating film 708, a semiconductor layer 705, an N-type semiconductor layer 706 as a semiconductor layer having one conductivity type and an electrode layer 707 are laminated over a gate electrode 703, and a region to be a channel formation region of the semiconductor layer 705 is etched to be thin. Reference numeral 712 denotes a first electrode; 713, a light emitting layer; 714, a second electrode; 716, a passivation film; 725, a sealant; 715, an insulating layer; 722, a filler; 723, a sealing substrate; 784, a wiring layer; 780 and 781, terminal electrodes; 782, an anisotropy conductive film; and 783, an FPC. An insulating layer 715 in a display device in FIG. 8 has a structure which functions as an interlayer insulating layer and an insulating layer to be a partition wall in the display device in Embodiment Mode 1.

Both display devices having inverse stagger type TFTs in FIGS. 8 and 9 are bottom emission type display devices in which light is emitted from the element substrate side, and a conductive film having light-transmitting properties is used as the first electrode. Degasification is not generated in the display devices since heat treatment is performed on the first electrode after the formation; therefore, there is no possibility that a light emitting material to be formed thereover is deteriorated.

The above-mentioned semi-amorphous semiconductor film can be used as the semiconductor layer. The semiconductor layer having one conductivity type may be formed, if necessary.

TFTs in pixel portions in this embodiment mode are n-channel type TFTs, and the first electrodes (pixel electrodes) 712 and 1412 are functioned as cathodes, and the second electrodes 714 and 1414 are functioned as anodes. In this embodiment mode, ITSO which is a transparent conductive layer is used for the first and second electrodes. The structure is as follows: the first electrode (ITSO)/an electron injection layer (BzOS—Li in which a benzoxazole derivative (BzOs) is added into Li)/an electron transport layer (Alq)/a light emitting layer (Alq added with quinacridone derivatives (DMQd))/a hole transport layer (4,4'-bis [N-(1-naphthyl)-N-phenyl-amino]-biphenyl (α-NPD))/a hole injection layer (molybdenum oxide (MoOx))/the second electrode (ITSO). Materials for an anode; a cathode; and an electron injection layer, an electron transport layer, a light emitting layer, a hole transport layer, and a hole injection layer which form the light emitting layer are not limited to this embodiment. The materials may be appropriately selected and combined.

Through the above-mentioned steps, a display device in which degasification is not generated can be manufactured without increasing the number of steps; therefore, a light emitting element can be prevented from deteriorating. Hence, a highly reliable display device which can display a high-definition and high-quality image can be manufactured with a preferable yield.

Embodiment Mode 5

Figure 17:
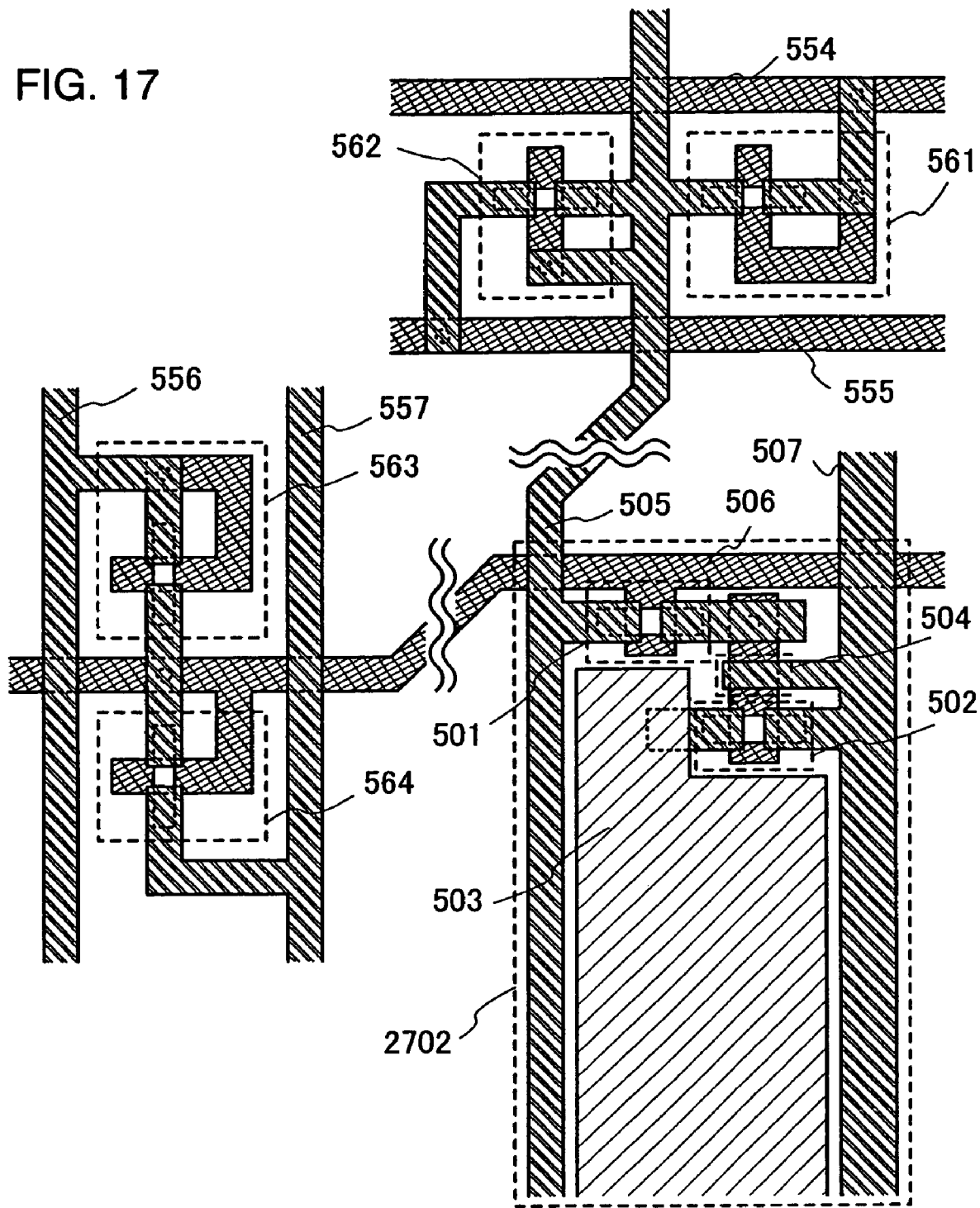
FIG. 17 shows a top view describing an EL display panel according to a certain aspect of the invention.
Figure 18A:
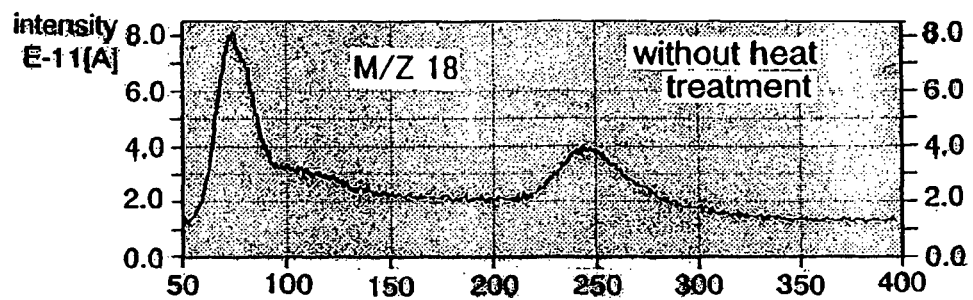
FIGS. 18A to 18E are graphs which show TDS measurement results of an ITSO film.
Figure 18B:
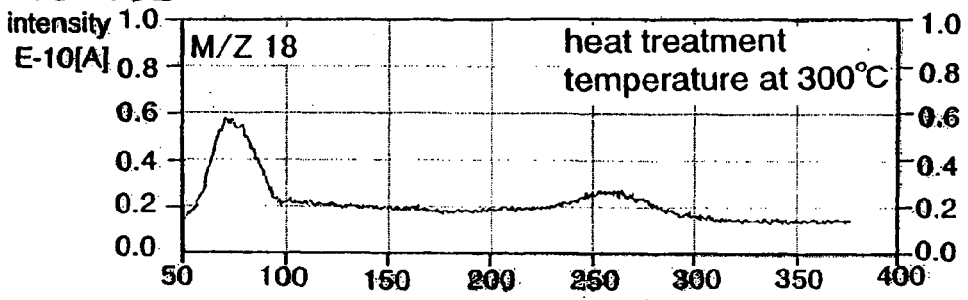
Figure 18C:
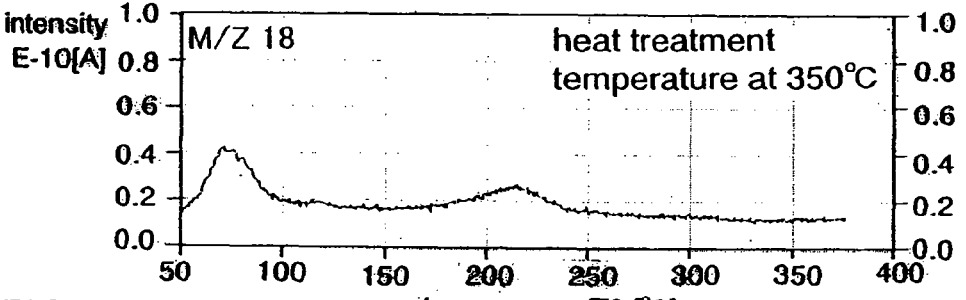
Figure 18D:
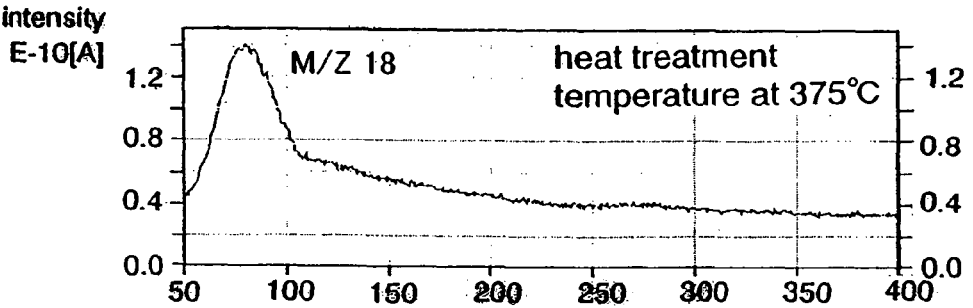
Figure 18E:
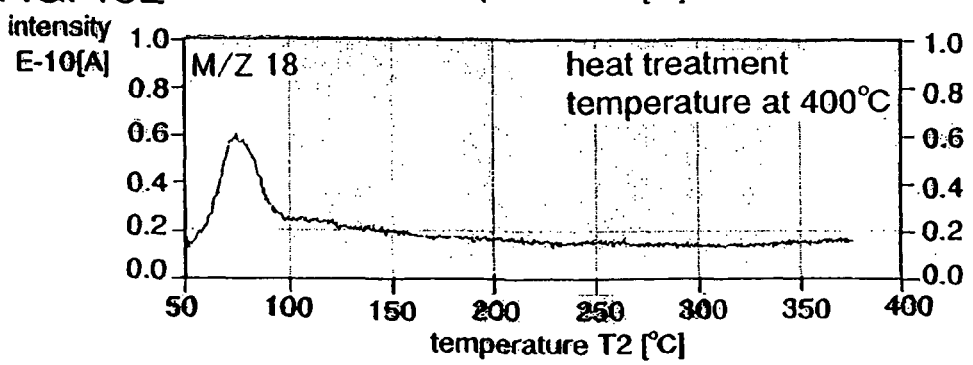

One mode in which a protective diode is provided for a scanning line input terminal portion and a signal line input terminal portion is explained with reference to FIG. 17. In FIG. 17, a pixel 2702 is provided with TFTs 501 and 502, a capacitor 504 and a light emitting element 503. These TFTs have the same structure as that of Embodiment Mode 4.

Figure 16:
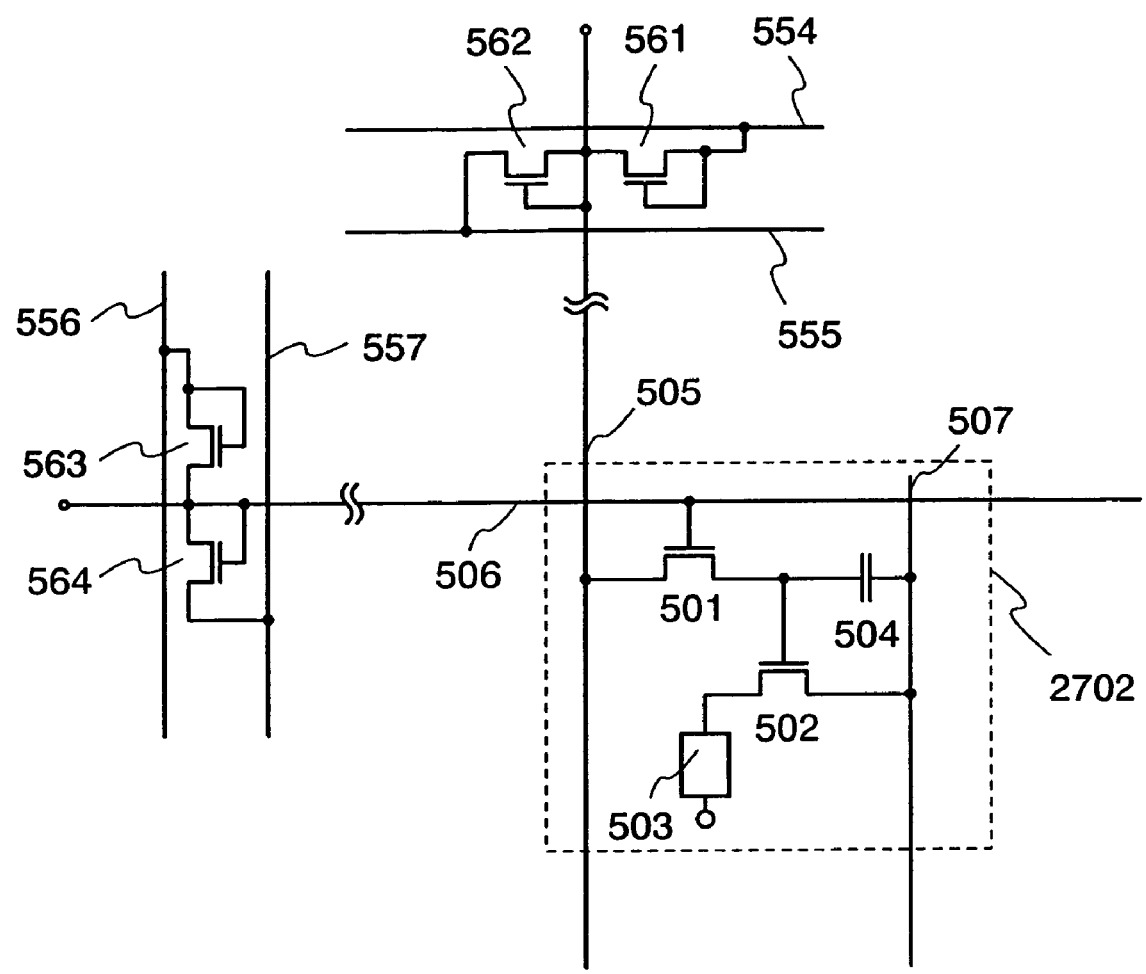
FIG. 16 shows an equivalent circuit diagram of an EL display device which is to be described with reference to FIG. 17.

Protective diodes 561 and 562 are provided for the signal line input terminal portion. This protective diodes are manufactured in the same step as the TFT 501 or 502, and being operated as a diode by being connected to a gate and one of a drain or a source. FIG. 16 shows an equivalent circuit diagram of a top view shown in FIG. 17.

The protective diode 561 includes a gate electrode layer, a semiconductor layer and a wiring layer. The protective diode 562 has a similar structure. Common potential lines 554 and 555 connecting to this protective diode are formed in the same layer as the gate electrode layer. Thus, it is necessary to form a contact hole in the gate insulating layer to electrically connect to the wiring layer.

A mask layer may be formed and etching process may be carried out to form the contact hole in the gate insulating layer. In this case, when etching process by atmospheric pressure discharge is applied, local discharge process is also possible, and it is not necessary to form the mask layer over an entire surface of the substrate.

A signal wiring layer is formed in the same layer as a source or drain wiring layer 505 in the TFT 501 and has a structure in which the signal wiring layer connected thereto is connected to a source side or a drain side of the TFT 501.

The input terminal portion of the scanning line also has the same structure. A protective diode 563 includes a gate electrode layer, a semiconductor layer and a wiring layer. A protective diode 564 has the same structure. Common potential lines 556 and 557 connecting to this protective diode are formed in the same layer as the source or drain wiring layer.

According to the present invention, the protective diodes provided in an input stage can be formed at the same time. Note that the positions of depositing the protective diodes are not limited to this embodiment mode and can be provided between a driver circuit and a pixel.

Embodiment Mode 6

Figure 13:
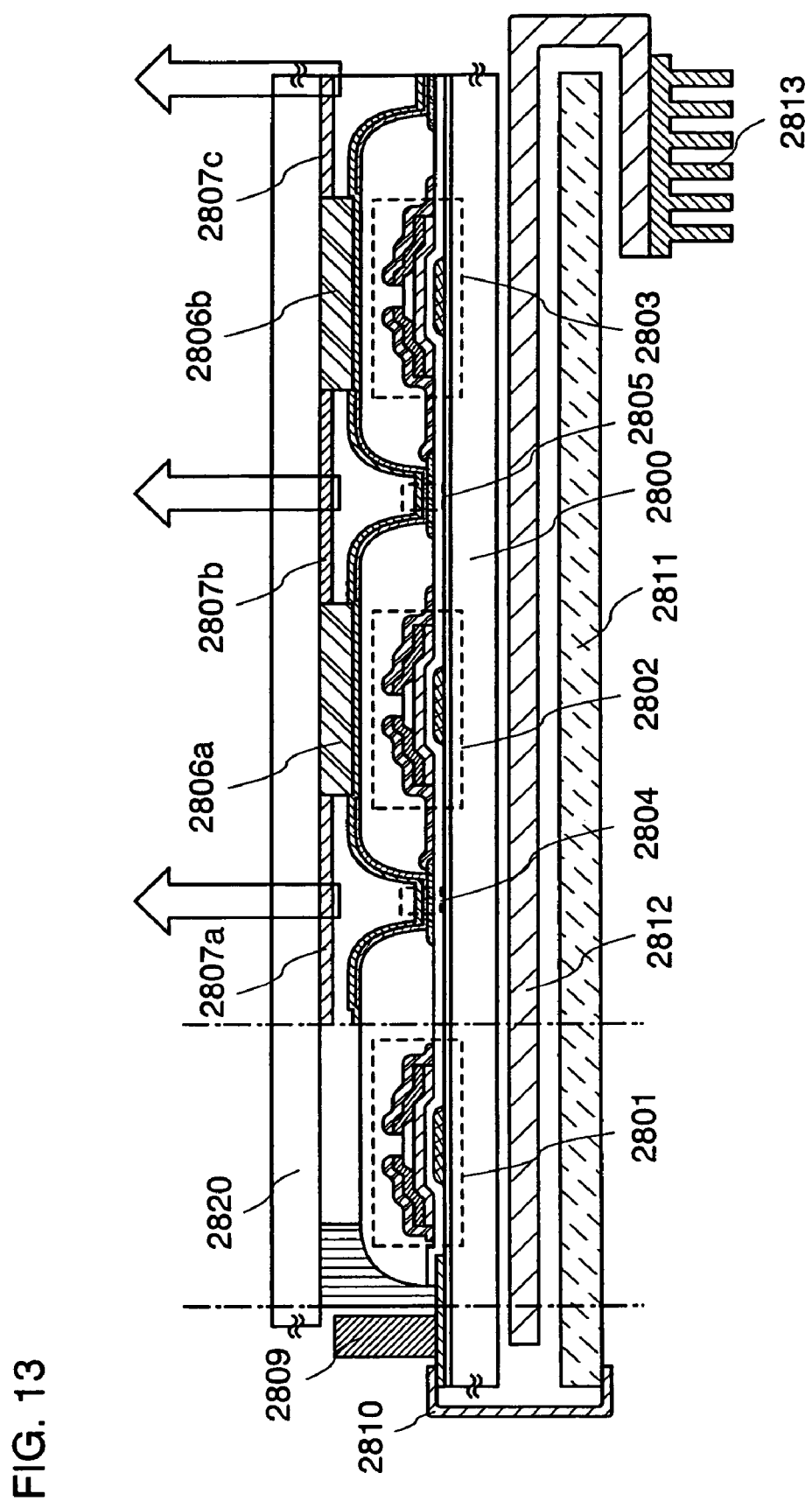
FIG. 13 shows a cross-sectional view describing a structure example of an EL display module according to a certain aspect of the invention.

FIG. 13 shows an example constituting an EL display module having a TFT substrate 2800 manufactured according to the present invention. A pixel portion composed of pixels is formed over the TFT substrate 2800, and includes TFTs 2802 and 2803 in the figure.

In FIG. 13, a TFT which is the same as that formed in a pixel or a protective circuit portion 2801 operated in the same manner as a diode by being connected to a gate and one of a source or a drain of the TFT is provided between a driver circuit and the pixel which is outside of the pixel portion. A driver IC formed of a single crystal semiconductor, a stick driver IC formed of a polycrystalline semiconductor film over a glass substrate, or a driver circuit formed of a SAS is applied to a driver circuit 2809.

The TFT substrate 2800 is bonded to a sealing substrate 2820 by interposing spacers 2806a and 2806b therebetween. A space between two substrates can be kept constantly by the spacers even when a substrate is thin and an area of a pixel portion is enlarged; therefore, the spacer is preferable to be provided. A space between the TFT substrate 2800 and the sealing substrate 2820 over light emitting elements 2804 and 2805 may be filled with a light-transmitting resin material and solidified, or may be filled with anhydrous nitrogen or an inert gas.

FIG. 13 shows the case in which the light emitting elements 2804 and 2805 have a structure of a top emission type and has a structure in which light is emitted in a direction of an arrow shown in the figure. Multicolor display can be carried out in each pixel by having different luminescent colors of red, green and blue. In addition, at this time, color purity of the luminescence emitted outside can be enhanced by forming colored layers 2807a, 2807b and 2807c corresponding to each color on the sealing substrate 2820 side. Moreover, the colored layers 2807a, 2807b and 2807c may be combined by using the pixel as a white light emitting element.

The driver circuit 2809 and a wiring substrate 2811 are connected to each other through a scanning line or signal line connection terminal provided over one end of the TFT substrate 2800 and a wiring substrate 2810. In addition, a heat pipe 2813 and a heat sink 2812 may be provided to be in contact with or close to the TFT substrate 2800 to have a structure improving a heat effect.

FIG. 13 shows the top emission type EL display module, however, it may be a bottom emission structure by changing the structure of the light emitting element or the disposition of the external circuit substrate. In the case of the top emission structure, the insulating layer which is to be a partition wall may be colored to be used as a black matrix. This partition wall can be formed by a droplet discharge method or the like and it may be formed by mixing a black resin of a pigment system, carbon black or the like into a resin material such as polyimide, or a lamination thereof may be also used.

Additionally, in the TFT substrate 2800, a sealing structure may be formed by attaching a resin film to the side where the pixel portion is formed with the use of a sealant or an adhesive resin. A gas barrier film which prevents moisture from penetrating is preferably provided on the surface of a resin film.

By having a structure in which the TFT substrate 2800 is sealed with the resin film, a further thinned and lightweight module can be obtained.

Embodiment Mode 7

Figure 14C:
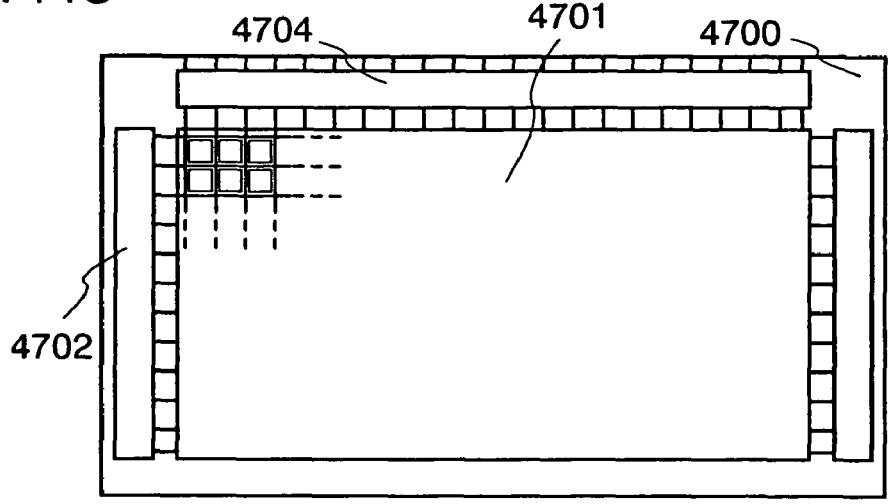

A television device can be completed by a display device formed according to the present invention. A display panel can be formed in any manners as follows: as the structure shown in FIG. 14A, in the case where only a pixel portion is formed, and then a scanning line driver circuit and a signal line driver circuit are mounted by a TAB method as shown in FIG. 15B; as the structure shown in FIG. 14A, in the case where only a pixel portion is formed, and then a scanning line driver circuit and a signal line driver circuit are mounted by a COG method as shown in FIG. 15A; a TFT is formed of a SAS, a pixel portion and a scanning line driver circuit are integrally formed over a substrate, and a signal line driver circuit is separately mounted as a driver IC as shown in FIG. 14B; and a pixel portion, a signal line driver circuit, and a scanning line driver circuit are integrally formed over the substrate as shown in FIG. 14C; or the like.

Another structure of an external circuit includes a video signal amplifier circuit which amplifies a video signal received by a tuner; a video signal processing circuit which converts the video signal outputted therefrom into a chrominance signal corresponding to each color of red, green, and blue; a control circuit which converts the video signal into an input specification of a driver IC; and the like on inputting side of the video signal. The control circuit outputs the signal into the scanning line side and the signal line side, respectively. In the case of digital driving, a signal division circuit may be provided on the signal line side so as to have a structure in which an input digital signal is provided by dividing into m-pieces.

Among a signal received from the tuner, an audio signal is transmitted to an audio signal amplifier circuit, and the output thereof is provided for a speaker through an audio signal processing circuit. A control circuit receives control information of a receiving station (a receiving frequency) or sound volume from an input portion and transmits the signal to the tuner or the audio signal processing circuit.

Figure 10:
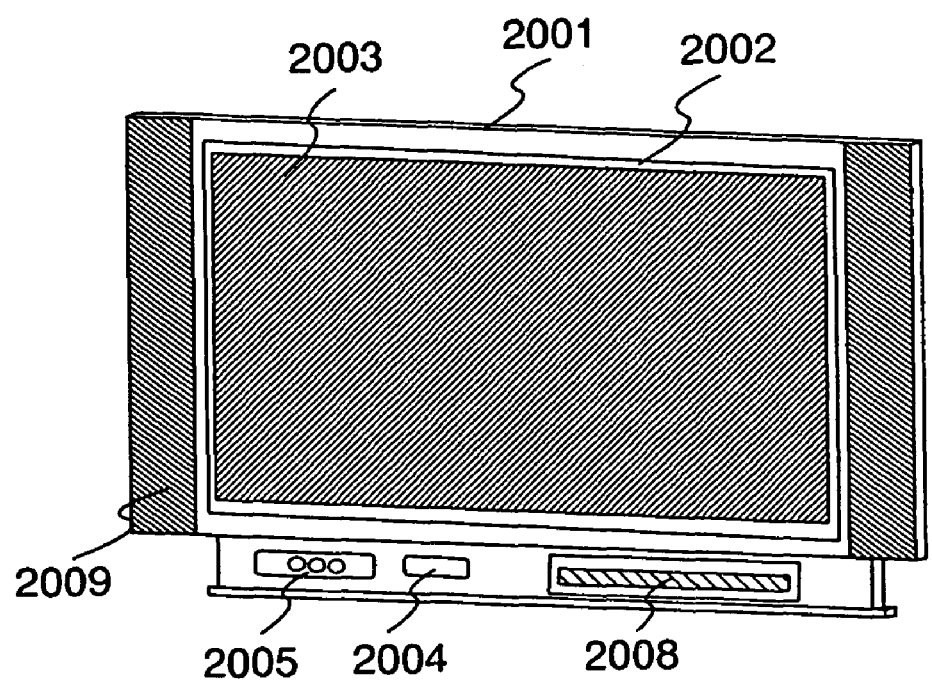
FIG. 10 shows a figure describing an electronic device to which a certain aspect of the invention is applied.
Figure 10:
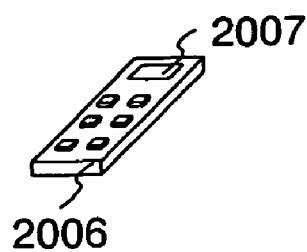

As shown in FIG. 10, a television device can be completed by incorporating a display module into a casing 2001. An EL television device can be completed by using such an EL display module like in FIG. 13. A main screen 2003 is formed by using the display module, and a speaker portion 2009, operation switches, and the like are provided as other attached equipments. In such a manner, the television device can be completed according to the invention.

In addition, reflected light of light entered from exterior may be shielded by using a retardation film and a polarizing plate. λ/4\λ/2 may be used as a retardation film and may be designed to be able to control light. The structure is as follows: a TFT element substrate\a light emitting element\a sealing substrate (sealant)\a retardation film (λ/4\λ/2)\a polarizing plate, in which light emitted from the light emitting element is emitted outside of the polarizing plate side to transmit them. The retardation film and polarizing plate may be provided on a side where light is emitted or may be provided on the both sides in the case of a dual emission type display device in which light is emitted from the both faces. In addition, an anti-reflective film may be provided on the outer side of the polarizing plate. Accordingly, a higher definition and more precise image can be displayed.

A display panel 2002 using an EL element is incorporated into the casing 2001. Information communication can be also carried out in one direction (from a transmitter to a receiver) or in the both directions (between a transmitter and a receiver or between receivers) by connecting to a communications network by a fixed line or a wireless through a modem 2004. For example, general television broadcasting is received from a receiver 2005. The operation of the television device can be carried out by switches incorporated into the casing or by a remote control device 2006, which is separated from the main body. A display portion 2007 that displays information to be outputted may be also provided for this remote control device.

In addition, in the television device, a structure displaying a channel, sound volume, or the like may be additionally provided by forming a sub-screen 2008 of a second display panel in addition to the main screen 2003. A structure in which the main screen 2003 is formed of the EL display panel superior in a viewing angle and the sub-screen is also formed of the EL display panel to be able to flash on and off may be also applied. According to the invention, a display device with high reliability can be manufactured even by using many TFTs and electronic parts by using such a large-sized substrate.

Of course, the invention is not limited to the television device and it can be applied to various usages especially as the display mediums having a large area such as an information display board at a station, an airport, or the like, or an advertisement display board on the street as well as a monitor of a personal computer.

Embodiment Mode 8

Various display devices can be manufactured by applying the present invention. In other words, the invention can be applied to various electronic devices in which these display devices are incorporated into display portions.

The electronic devices include a camera such as a video camera or a digital camera, a projector, a head mounted display (a goggle type display), a car navigation system, a car stereo, a personal computer, a game machine, a portable information terminal (a mobile computer, a cellular phone, an electronic book, or the like), an image reproducing device provided with a recording medium (specifically a device that is capable of playing a recording medium such as a Digital Versatile Disc (DVD) and that has a display device that can display the image) or the like. FIGS. 11A to 11D show the examples thereof.

Figure 11A:
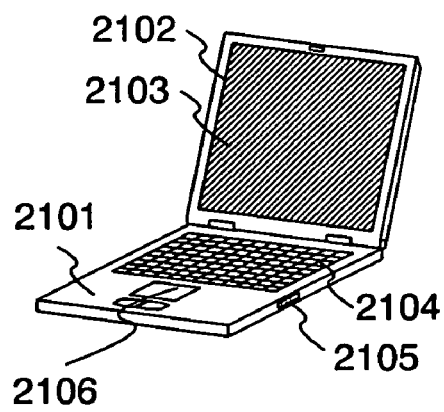
FIGS. 11A to 11D show figures describing electronic devices to which a certain aspect of the invention is applied.

FIG. 11A is a personal computer, which includes a main body 2101, a casing 2102, a display portion 2103, a keyboard 2104, an external connection port 2105, a pointing mouse 2106 and the like. The invention is applied to manufacturing the display portion 2103. According to the invention, an image with high reliability and high resolution can be displayed even when the laptop personal computer often taken out outside is used for a long time in harsh conditions.

Figure 11B:
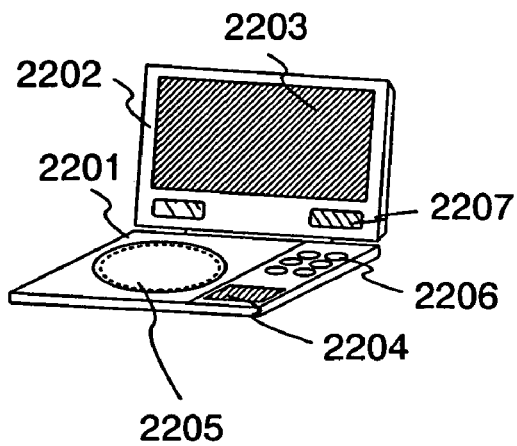

FIG. 11B is an image reproducing device provided with a recording medium (specifically a DVD reproducing device), which includes a main body 2201, a casing 2202, a display portion A 2203, a display portion B 2204, a recording medium (such as a DVD) reading portion 2205, operation keys 2206, a speaker portion 2207 and the like. The display portion A 2203 mainly displays image information and the display portion B 2204 mainly displays character information, and the invention is applied to manufacturing these display portions A 2203 and B 2204. According to the invention, an image with high reliability and high resolution can be displayed for a long time.

Figure 11C:
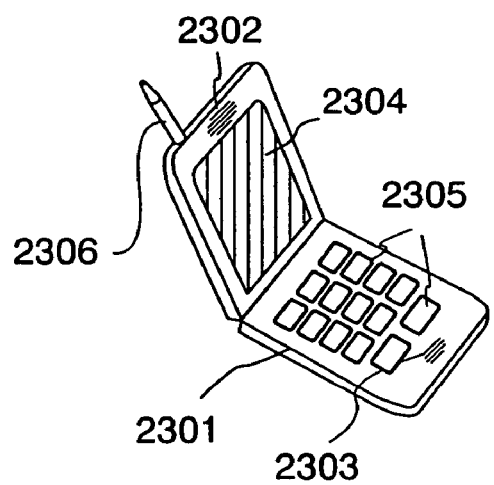

FIG. 11C is a cellular phone, which includes a main body 2301, an audio output portion 2302, an audio input portion 2303, a display portion 2304, operation switches 2305, an antenna 2306 and the like. By applying the display device manufactured according to the invention to the display portion 2304, display with high reliability and high resolution can be made for a long time even in the case of the cellular phone often used in high-temperature and humid circumstances such as outside.

Figure 11D:
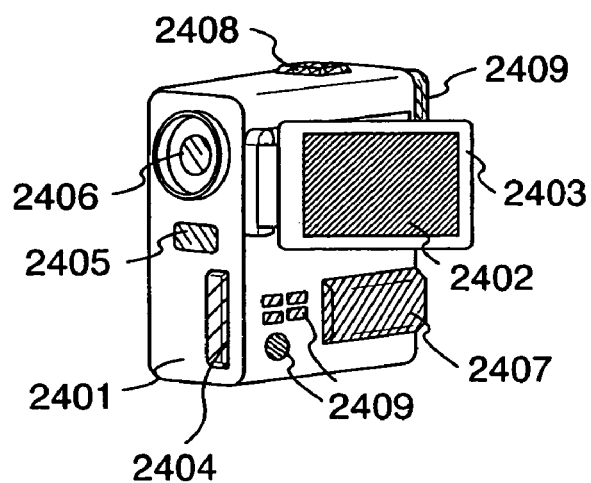

FIG. 11D is a video camera, which includes a main body 2401, a display portion 2402, a casing 2403, an external connection port 2404, a remote control receiving portion 2405, an image receiving portion 2406, a battery 2407, an audio input portion 2408, operation keys 2409 and the like. By applying the display device manufactured according to the invention to the display portion 2402, display with high reliability and high resolution can be made even when the video camera is used in high-temperature and humid circumstances such as outside for a long time.

Figure 12:
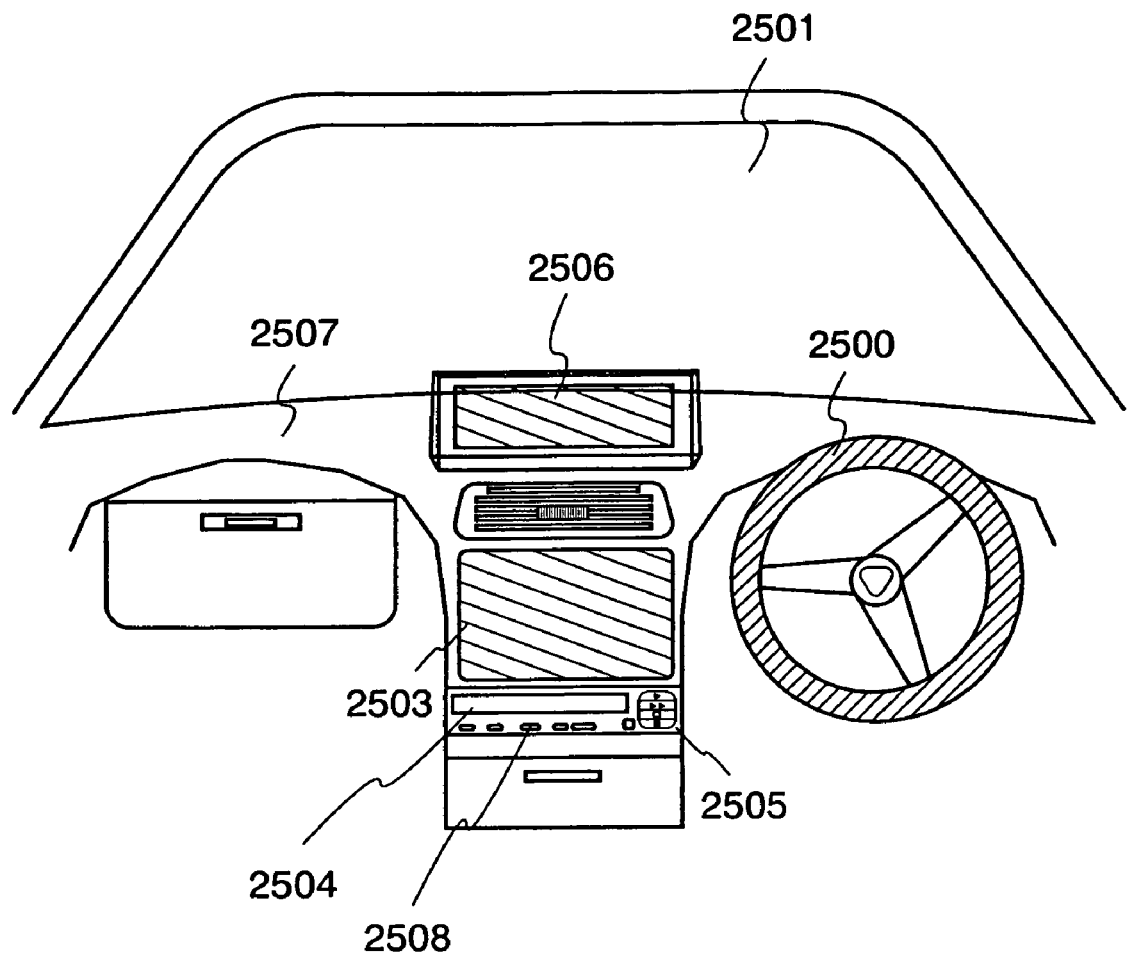
FIG. 12 shows a figure describing an electronic device to which a certain aspect of the invention is applied.

FIG. 12 shows an example in which the display portion is mounted on an automobile. An automobile is used here as a typical example of a vehicle; however, it is not limited thereto and also applicable to an aircraft, a train, an electric train or the like. It is important that the display device mounted specifically on the automobile has high reliability even in harsh circumstances (an automobile which tends to be high-temperature and humid therein).

FIG. 12 is a view showing a periphery of a driver seat of the automobile. An audio reproducing device, specifically a car audio or a car navigation system is provided for a dash board 2507. A main body 2505 of the car audio includes a display portion 2504 and operation buttons 2508. By applying the invention to a display portion 2503, a car audio provided with high reliability can be completed.

In addition, a car navigation system provided with high reliability can be also completed by applying the invention to the display portion 2503 of the car navigation system and to a display portion 2506 displaying an air conditioning state in the automobile.

In addition, this embodiment mode shows a vehicle-mounted car audio and a car navigation system, however, it may be applied also to an indicator of other vehicles, or a stationary audio or a navigation device.

As mentioned above, the application range of the invention is extremely wide and the invention can be applied to electronic devices of various fields.

Embodiment 1

In this embodiment, the present invention is described with reference to experimental results.

In this embodiment, a conductive layer which is to be used as a first electrode is formed over a substrate, and an experiment on the change of moisture content due to the application of heat was performed.

A glass substrate was used as the substrate, and an ITSO film which is to be used as the first electrode was evaporated to have a film thickness of 110 nm by a sputtering method to form a sample. The sample was heated in a reduced pressure CVD apparatus at each temperature. The heat treatment temperatures were 300° C., 350° C., 375° C. and 400° C., respectively, and after heating them under a reduced pressure of $3.2 \times 10^{-4}$ Pa for 12 hours, moisture content which was emitted as degasification was measured. TDS (Thermal Desorption Spectroscopy) was used as a measurement. TDS is spectroscopy to measure a gas molecular which is emitted from a sample at each temperature by heating the sample which is a measuring object.

Totally, there were five samples of ITSO films including a sample on which heat treatment is not conducted (at room temperature, about 25° C.). FIGS. 18A to 18E show the measurement results of the sample without heat treatment, samples each of which has heat treatment temperatures of 300° C., 350° C., 375° C. and 400° C., respectively, from the top. In FIGS. 18A to 18E, a measured gas molecular indicated by the vertical axes are shown in an arbitrary intensity.

The ITSO film without being heat-treated had two degasification peaks, and the first peak was between 50° C. and 100° C., and the second peak was between 200° C. to 300° C. at the substrate temperature (T2) according to the TDS apparatus. The T2 of the horizontal axis is a substrate temperature measured by the TDS apparatus used for the measurement, and there is an error due to device dependence. The actual temperature of the substrate was higher by from 70° C. to 80° C.; therefore, the second peak of the sample without heat treatment was around from 270° C. to 380° C.

Figure 22:
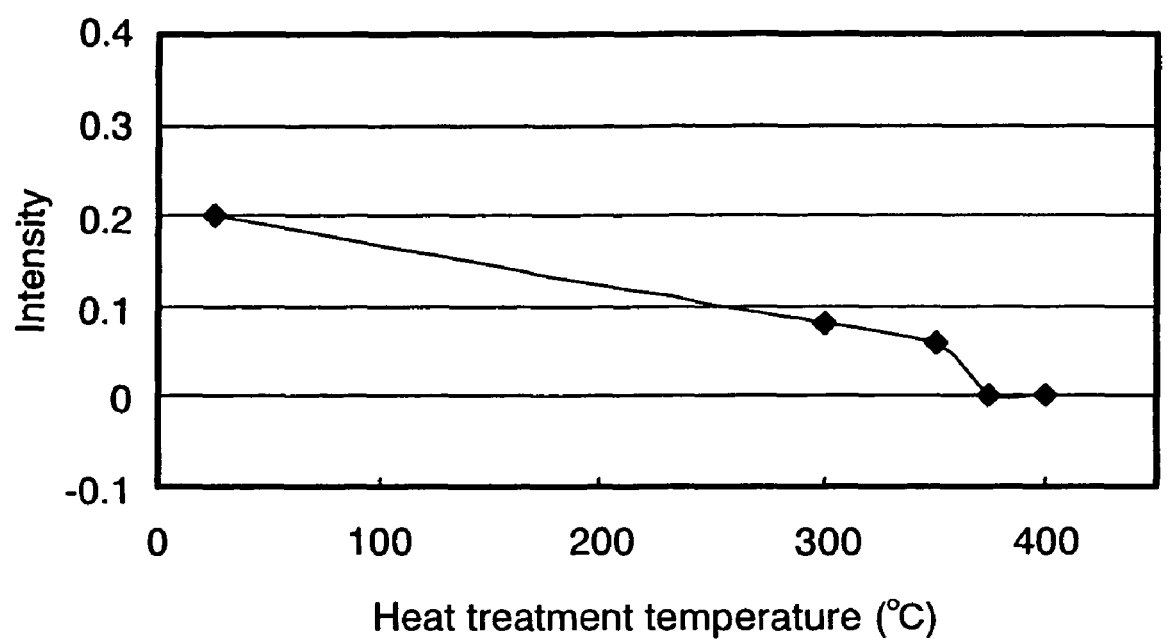
FIG. 22 is graph which show the relation between moisture intensity and heat treatment temperature according to TDS measurement of an ITSO film.

FIG. 22 shows a change of the amount of moisture released as degasification indicated by the second peak in FIGS. 18A to 18E (shown as the arbitrary intensity) with respect to heat treatment temperatures. According to FIGS. 18A to 18E and 22, the second peak due to degasification decreases toward the heat treatment temperatures of 300° C. to 350° C. compared with without heat treatment (room temperature of 25° C.), and the peak disappeared at the heat treatment temperatures of 375° C. to 400° C. Hence, it is confirmed that degasification from the ITSO film can be suppressed by heat treatment. According to the invention, a light emitting element can be prevented from deteriorating due to degasification.

Figure 19A:
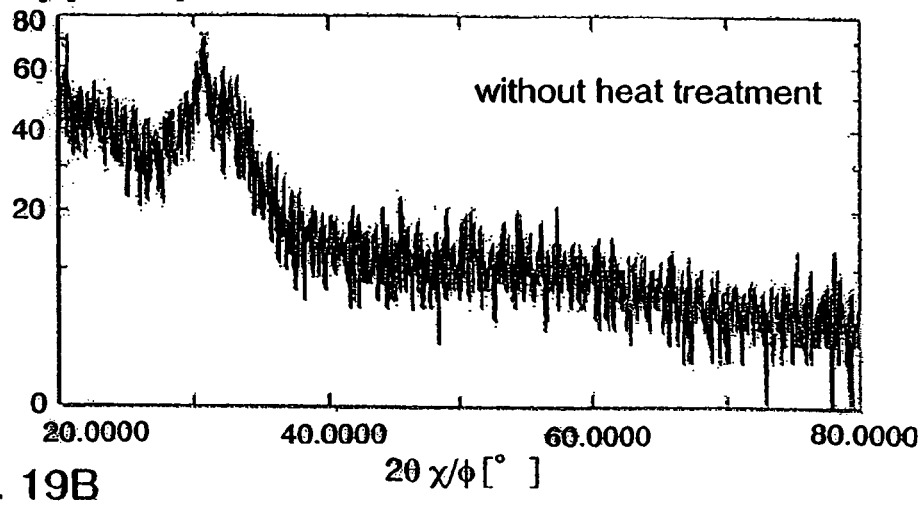
FIGS. 19A to 19C are graphs which show XRD analysis results of an ITO film.
Figure 19B:
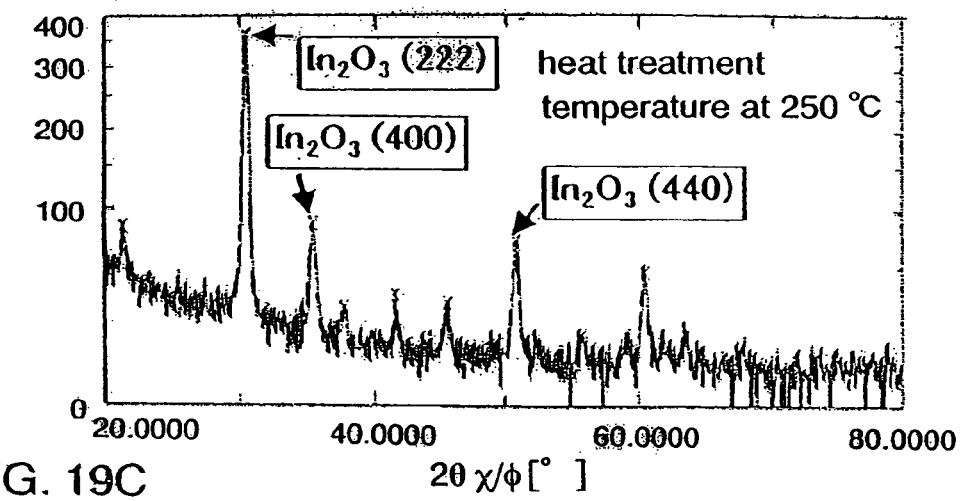
Figure 19C:
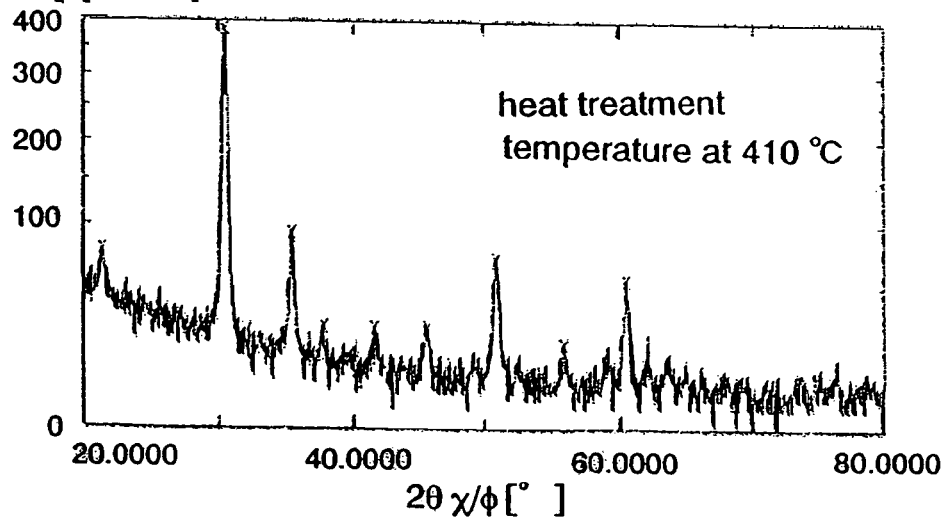
Figure 20A:
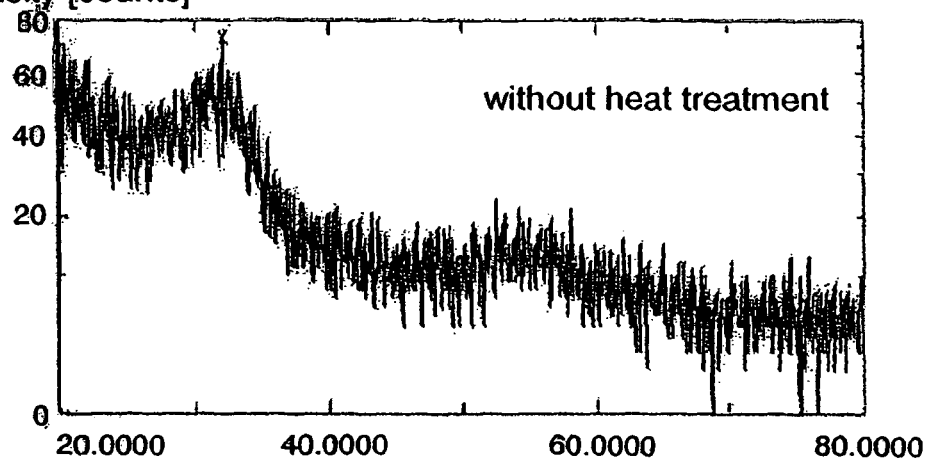
FIGS. 20A to 20C are graphs which show XRD analysis results of an ITSO film.
Figure 20B:
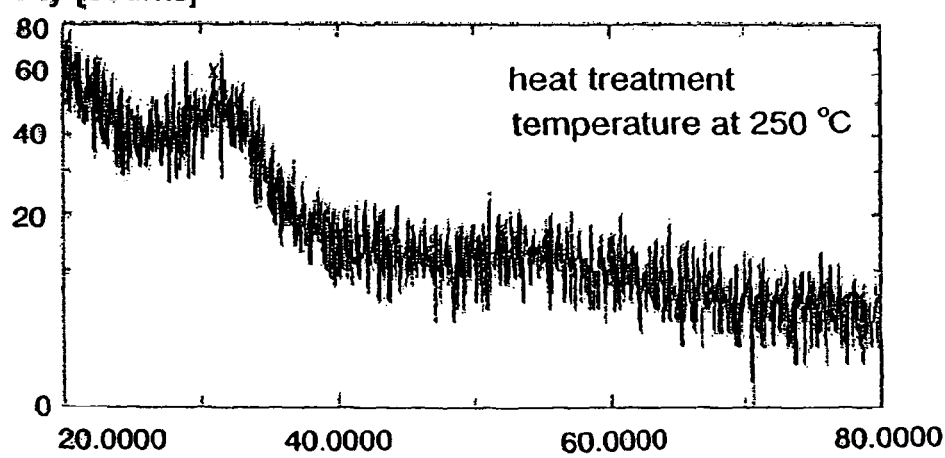
Figure 20C:
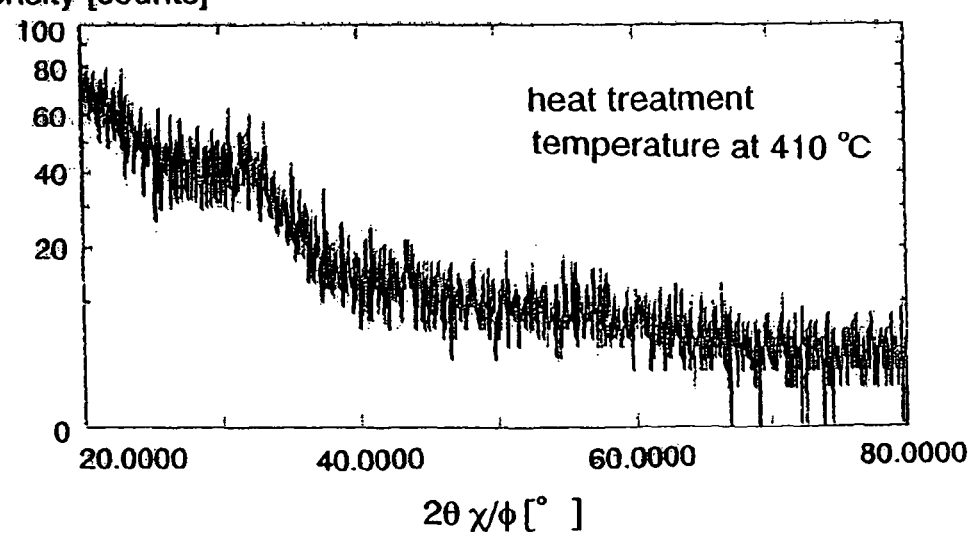

Crystallinity was measured with XRD (X-ray diffractometer) to investigate the change of the surface state due to heat treatment of the ITO film and the ITSO film. XRD is an apparatus to obtain information on the periodicity of atomic and molecular positions in a substance by utilizing a diffraction phenomenon of a wave, and the ITO film and the ITSO film, which were amorphous states, were whether they were crystallized or not according to the heat treatment. FIGS. 19A to 19C show the XRD analysis result of the ITO film, and FIGS. 20A to 20C show that of the ITSO film. The measurement results of the films without heat treatment, films each of which has heat treatment temperatures of 250° C. and 410° C., respectively, are shown from the top in FIGS. 19A to 19C and 20A to 20C. In the samples, SiNO films were formed to have a film thickness of 100 nm as a base film over the samples before forming the ITO films and the ITSO films thereover and 10 wt. % of $SiO_2$ was added into the ITSO films. The heat treatment was conducted under atmospheric pressure and nitrogen atmosphere for one hour.

As shown in FIGS. 19A to 19C, in the ITO films, diffraction peaks of (222), (400) and (440) caused by crystallization of $In_2O_3$ was observed in the samples treated with heat treatment temperatures of 250° C. and 410° C., respectively. It is understood that the ITO film is crystallized by heat treatment. However, in the ITSO film as shown in FIGS. 20A to 20C, peaks caused by crystallization was not observed in all the samples without heat treatment and treated with heat treatment temperatures of 250° C. and 410° C. Therefore, it was confirmed that the ITSO film remains in an amorphous state having high planarity.

In addition to the measurement on the crystallinity with XRD, measurement was performed by an AFM (Atomic Force Microscope) as another method for investigating the change of the surface condition of the ITSO films. An AFM is a device to observe the surface shape of a sample by bringing an extremely small needle close to the sample surface and detecting the force between the sample surface and the needle (atomic force). With the use of the AFM, the maximum difference of elevation, average surface roughness and average roughness of the film surface projections of each sample which is heated at the temperatures of 250° C., 300° C., 350° C. and 410° C., respectively, for one hour were measured. Table 1 shows the result of the maximum difference of elevation; Table 2, the result of the average surface roughness; and Table 3, the average roughness. Within the area of 2 μm²33 2 μm² was measured. In average surface roughness measurement, the centerline average roughness is expanded to the three dimension in order to be applied to a plane, which is defied in JIS B0601. Average roughness shows the difference between the average value of from the maximum value to the fifth maximum value of convex portions and the average value of from the minimum value to the fifth minimum values of concave portions in the measurement region.

TABLE 1

| heat tratment temperature(° C.) | maximum difference of elevation (Å) base film | | | |
|---|---|---|---|---|
| | CVD-SiNO | | SP-SiN | |
| | ITO | ITSO | ITO | ITSO |
| 250 | 157.2 | 92.5 | 173.0 | 85.7 |
| 300 | 218.0 | 71.4 | 232.1 | 113.2 |
| 350 | 233.2 | 79.0 | 261.1 | 118.1 |
| 410 | 160.5 | 101.3 | 196.1 | 132.4 |

TABLE 2

| heat tratment temperature(° C.) | average surface roughness (Å) base film | | | |
|---|---|---|---|---|
| | CVD-SiNO | | SP-SiN | |
| | ITO | ITSO | ITO | ITSO |
| 250 | 6.36 | 5.71 | 7.57 | 7.18 |
| 300 | 6.41 | 5.43 | 7.86 | 6.72 |
| 350 | 6.54 | 4.99 | 8.87 | 6.01 |
| 410 | 6.81 | 4.90 | 7.06 | 5.52 |

TABLE 3

| heat tratment temperature(° C.) | average roughness (Å) base film | | | |
|---|---|---|---|---|
| | CVD-SiNO | | SP-SiN | |
| | ITO | ITSO | ITO | ITSO |
| 250 | 114.3 | 63.3 | 135.6 | 77.2 |
| 300 | 131.4 | 52.1 | 114.4 | 79.7 |
| 350 | 130.4 | 44.7 | 133.9 | 59.0 |
| 410 | 97.5 | 47.5 | 101.9 | 60.2 |

Figure 21A:
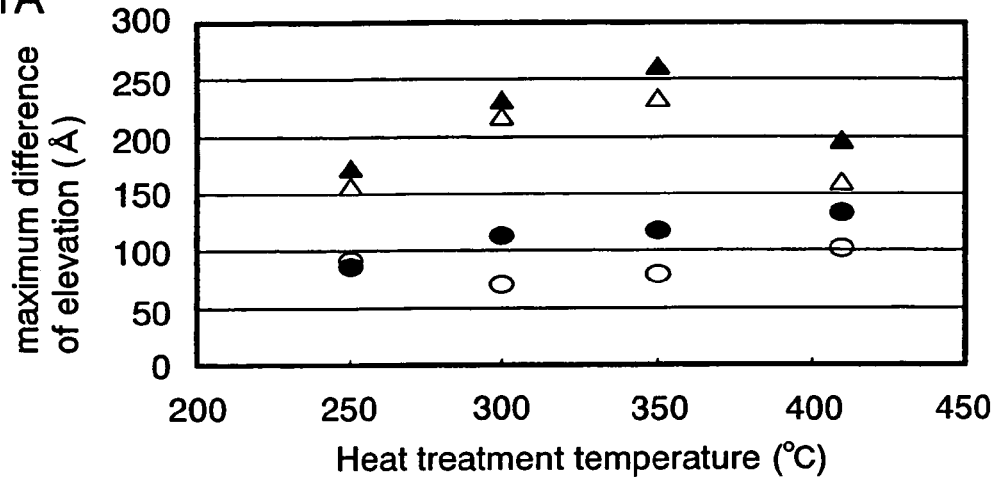
FIGS. 21A to 21C are graphs which show analysis results of surface roughness by an AFM.
Figure 21B:
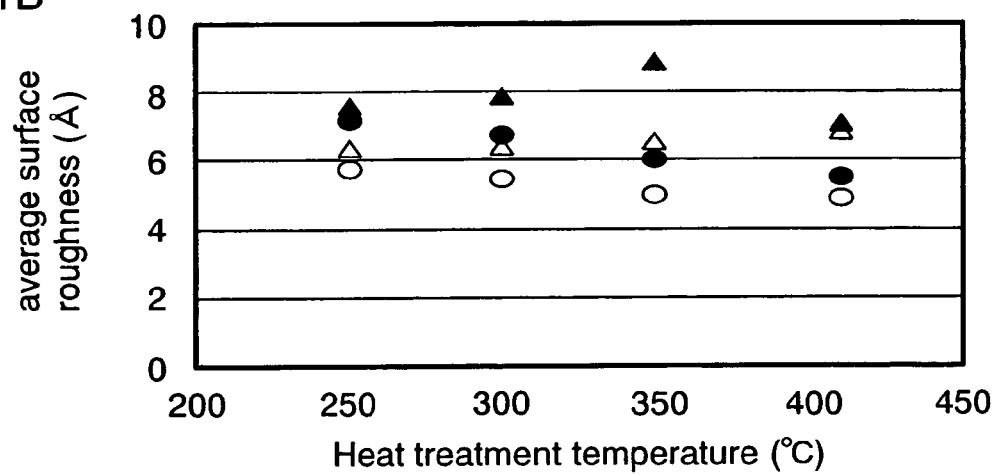
Figure 21C:
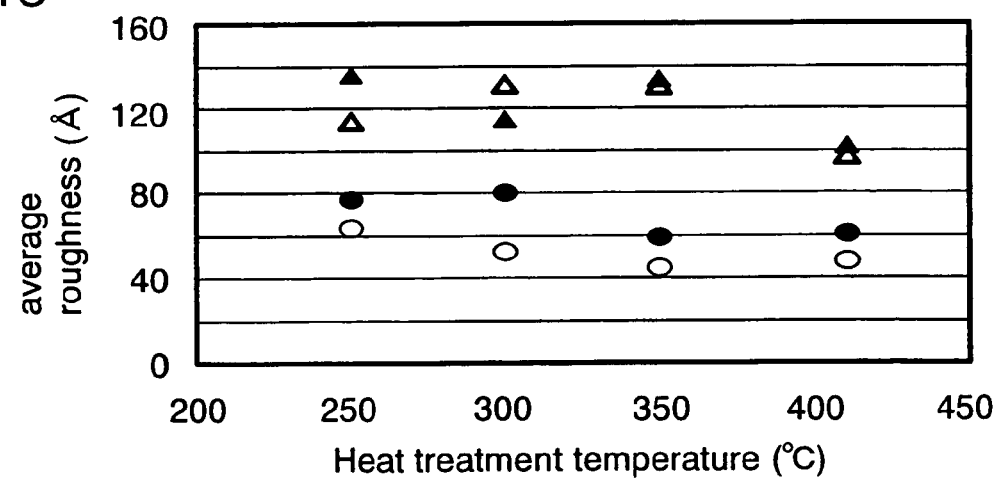

The surface condition becomes rougher as the values increases in each value of the above-mentioned maximum difference of elevation, average surface roughness and average roughness, which means the decrease in planarity. Tables 1 to 3 are graphed and FIGS. 21A to 21C show the results. The horizontal axis means heat treatment temperatures of an example in each graph, and the vertical axis in FIG. 21A shows the maximum difference of elevation of Table 1; FIG. 21B, the average surface roughness of Table 2; and FIG. 21C, the average roughness of Table 3. A base film was formed over the substrate and a transparent conductive film to be used as a first electrode is formed thereover in a measurement example. As the base film, a SINO film formed by a CVD method and a SiN film formed by a sputtering method were used, and as the transparent conductive film, an ITO film and an ITSO film formed by a sputtering method were used.

As shown in FIGS. 21A to 21C, the ITSO film had smaller values of the maximum difference of elevation, the average surface roughness and the average roughness than that of the ITO film; therefore, it is understood that the ITSO film has higher planarity than the ITO film. It was not confirmed that there was distinguished change due to the temperatures in the maximum difference of elevation, the average surface roughness and the average roughness, and it was not confirmed that there is change of planarity due to applying heat. The same tendency was obtained when the base film was changed; therefore, it can be said that the planarity is not dependent on the base film. According to the results, it was proved that an effect of eliminating degasification could be obtained without decreasing the planarity of the ITSO film even when heat treatment according to this embodiment was conducted.

According to the experimental results of this embodiment, it was confirmed that the conductive film manufactured according to this embodiment was provided with an effect of sufficiently preventing degasification, and the planarity of the film surface was not impaired due to the treatment. Hence, a display device using a conductive film to which the invention is applied is highly reliable since a light emitting element is prevented from deteriorating. Additionally, another heat step can be combined with the invention; therefore, a high-quality display device can be manufactured with a preferable yield without increasing the number of steps.

This application is based on Japanese Patent Application Ser. No. 2004-009778 filed in Japan Patent Office on Jan. 16, 2004, the contents of which are hereby incorporated by reference.

What is claimed is:

1. A method for manufacturing a display device comprising the steps of:
    forming an interlayer insulating layer over a substrate by an application method;
    removing an edge portion of the interlayer insulating layer;
    forming a first electrode comprising a conductive material added with a material which prevents crystallization over the interlayer insulating layer, the first electrode being amorphous;
    polishing the first electrode by using a CMP method after forming the first electrode;
    heating the first electrode under a pressure within a range of from $1 \times 10^{-6}$ Pa to $1 \times 10^{-2}$ Pa at a temperature of 350° C. or higher after forming the first electrode and after polishing the first electrode;
    forming a layer containing an organic compound over the first electrode after heating the first electrode; and
    forming a second electrode over the layer containing the organic compound.

2. A method for manufacturing a display device according to claim 1, wherein the first electrode comprises indium tin oxide as the conductive material and silicon oxide as the material which prevents crystallization.

3. A method for manufacturing a display device according to claim 1, wherein the step of heating the first electrode is performed for 12 hours or longer.

4. A method for manufacturing a display device according to claim 1, wherein the application method is one of a spin coating method and a droplet discharge method.

5. A method for manufacturing a display device according to claim 1, further comprising, after heating the first electrode, forming an insulating layer to cover an end portion of the first electrode; and heating the insulating layer after forming the insulating layer.

6. A method for manufacturing a display device comprising the steps of:

forming an interlayer insulating layer over a substrate;

removing an edge portion of the interlayer insulating layer;

forming a first electrode, comprising a conductive material added with a material which prevents crystallization, over the interlayer insulating layer, the first electrode being amorphous;

polishing the first electrode by using a CMP method after forming the first electrode;

heating the first electrode under a pressure within a range of from $1\times10^{-6}$ Pa to $1\times10^{-2}$ Pa at a temperature of 350° C. or higher after forming the first electrode and after polishing the first electrode;

forming an insulating layer to cover an end portion of the first electrode;

forming a layer containing an organic compound over the first electrode after heating the first electrode and forming the insulating layer; and forming a second electrode over the layer containing the organic compound.

7. A method for manufacturing a display device according to claim 6, wherein the first electrode comprises indium tin oxide as the conductive material and silicon oxide as the material which prevents crystallization.

8. A method for manufacturing a display device according to claim 6, wherein the step of heating the first electrode is performed for 12 hours or longer.

9. A method for manufacturing a display device according to claim 6, further comprising, after heating the first electrode, heating the insulating layer after forming the insulating layer.

10. A method for manufacturing a display device comprising the steps of:

forming a thin film transistor having a wiring;

forming an insulating film containing hydrogen over the thin film transistor;

forming a first electrode comprising a conductive material added with a material which prevents crystallization so as to be in contact wit the wiring, the first electrode being amorphous;

performing hydrogenation of the thin film transistor and dehydration of the first electrode simultaneously by heating the thin film transistor, the insulating film and the first electrode under a pressure within a range of from $1\times10^{-6}$ Pa to $1\times10^{-2}$ Pa at a temperature of 350° C. or higher after forming the thin film transistor, the insulating film and the first electrode;

forming a layer containing an organic compound over the first electrode after heating the thin film transistor, the insulating film and the first electrode; and forming a second electrode over the layer containing the organic compound.

11. A method for manufacturing a display device according to claim 10, wherein the first electrode comprises indium tin oxide as the conductive material and silicon oxide as the material which prevents crystallization.

12. A method for manufacturing a display device according to claim 10, wherein the step of heating the thin film transistor, the insulating film and the first electrode is performed for 12 hours or longer.

13. A method for manufacturing a display device comprising the steps of:

forming a thin film transistor having a wiring;

forming an insulating film containing hydrogen over the thin film transistor;

forming a first electrode comprising a conductive material added with a material which prevents crystallization so as to be in contact with the wiring, the first electrode being amorphous;

performing hydrogenation of the thin film transistor and dehydration of the first electrode simultaneously by heating the thin film transistor, the insulating film, and the first electrode under a pressure within a range of from $1\times10^{-6}$ Pa to $1\times10^{-2}$ Pa at a temperature of 350° C. or higher after forming the thin film transistor, the insulating film, and the first electrode;

forming an insulating layer to cover the thin film transistor, the wiring and an end portion of the first electrode;

forming a layer containing an organic compound over the first electrode after heating the thin film transistor, the insulating film, and the first electrode, and forming the insulating layer; and forming a second electrode over the layer containing an organic compound.

14. A method for manufacturing a display device according to claim 13, wherein the first electrode comprises indium tin oxide as the conductive material and silicon oxide as the material which prevents crystallization.

15. A method for manufacturing a display device according to claim 13, wherein the step of heating the thin film transistor, the insulating film, and the first electrode is performed for 12 hours or longer.

16. A method for manufacturing a display device comprising the steps of:

forming an interlayer insulating layer over a substrate by an application method;

removing an edge portion of the interlayer insulating layer;

forming a first electrode over the interlayer insulating layer, the first electrode being amorphous;

polishing the first electrode by using a CMP method after forming the first electrode;

heating the first electrode under a pressure within a range of from $1\times10^{-6}$ Pa to $1\times10^{-2}$ Pa at a temperature of 350° C. or higher at which the first electrode is not crystallized after forming the first electrode and after polishing the first electrode;

forming a layer containing an organic compound over the first electrode after heating the first electrode; and forming a second electrode over the layer containing the organic compound.

17. A method for manufacturing a display device according to claim 16, wherein the first electrode comprises indium tin oxide comprising silicon oxide.

18. A method for manufacturing a display device according to claim 16, wherein the step of heating the first electrode is performed for 12 hours or longer.

19. A method for manufacturing a display device according to claim 16, wherein the application method is one of a spin coating method and a droplet discharge method.

20. A method for manufacturing a display device according to claim 16, further comprising, after heating the first electrode, forming an insulating layer to cover an end portion of the first electrode; and heating the insulating layer after forming the insulating layer.

21. A method for manufacturing a display device comprising the steps of:

forming an interlayer insulating layer over a substrate;
removing an edge portion of the interlayer insulating layer;
forming a first electrode over the interlayer insulating layer, the first electrode being amorphous;
polishing the first electrode by using a CMP method after forming the first electrode;
heating the first electrode under a pressure within a range of from $1\times10^{-6}$ Pa to $1\times10^{-2}$ Pa at a temperature of 350° C. or higher at which the first electrode is not crystallized after forming the first electrode and after polishing the first electrode;
forming an insulating layer to cover an end portion of the first electrode;
forming a layer containing an organic compound over the first electrode after heating the first electrode and forming the insulating layer; and
forming a second electrode over the layer containing the organic compound.

22. A method for manufacturing a display device according to claim 21, wherein the first electrode comprises indium tin oxide comprising silicon oxide.

23. A method for manufacturing a display device according to claim 21, wherein the step of heating the first electrode is performed for 12 hours or longer.

24. A method for manufacturing a display device according to claim 21, further comprising, after heating the first electrode, heating the insulating layer after forming the insulating layer.

25. A method for manufacturing a display device comprising the steps of:
forming a thin film transistor having a wiring;
forming an insulating film containing hydrogen over the thin film transistor;
forming a first electrode so as to be in contact with the wiring, the first electrode being amorphous;
performing hydrogenation of the thin film transistor and dehydration of the first electrode simultaneously by heating the thin film transistor, the insulating film and the first electrode under a pressure within a range of from $1\times10^{-6}$ Pa to $1\times10^{-2}$ Pa at a temperature of 350° C. or higher at which the first electrode is not crystallized after forming the thin film transistor, the insulating film and the first electrode;
forming a layer containing an organic compound over the first electrode after heating the thin film transistor, the insulating film and the first electrode; and
forming a second electrode over the layer containing the organic compound.

26. A method for manufacturing a display device according to claim 25, wherein the first electrode comprises indium tin oxide comprising silicon oxide.

27. A method for manufacturing a display device according to claim 25, wherein the step of heating the thin film transistor, the insulating film and the first electrode is performed for 12 hours or longer.

28. A method for manufacturing a display device comprising the steps of:
forming a thin film transistor having a wiring;
forming an insulating film containing hydrogen over the thin film transistor;
forming a first electrode so as to be in contact with the wiring, the first electrode being amorphous;
performing hydrogenation of the thin film transistor and dehydration of the first electrode simultaneously by heating the thin film transistor, the insulating film, the first electrode under a pressure within a range of from $1\times10^{-6}$ Pa to $1\times10^{-2}$ Pa at a temperature of 350° C. or higher at which the first electrode is not crystallized after forming the thin film transistor, the insulating film, the first electrode;
forming an insulating layer to cover the thin film transistor, the wiring and an end portion of the first electrode;
forming a layer containing an organic compound over the first electrode after heating the thin film transistor, the insulating film, the first electrode and forming the insulating layer; and
forming a second electrode over the layer containing an organic compound.

29. A method for manufacturing a display device according to claim 28, wherein the first electrode comprises indium tin oxide comprising silicon oxide.

30. A method for manufacturing a display device according to claim 28, wherein the step of heating the thin film transistor, the insulating film, the first electrode is performed for 12 hours or longer.

* * * * *